(12) United States Patent
Ohta

(10) Patent No.: US 10,890,629 B2
(45) Date of Patent: Jan. 12, 2021

(54) MAGNETIC SENSOR

(71) Applicant: TDK CORPORATION, Tokyo (JP)

(72) Inventor: Naoki Ohta, Tokyo (JP)

(73) Assignee: TDK CORPORATION, Tokyo (JP)

( * ) Notice: Subject to any disclaimer, the term of this patent is extended or adjusted under 35 U.S.C. 154(b) by 212 days.

(21) Appl. No.: 16/044,967

(22) Filed: Jul. 25, 2018

(65) Prior Publication Data

US 2019/0079148 A1 Mar. 14, 2019

(30) Foreign Application Priority Data

Sep. 13, 2017 (JP) .................. 2017-176068

(51) Int. Cl.

| | |
|---|---|
| *G01R 33/09* | (2006.01) |
| *G01R 33/02* | (2006.01) |
| *G01R 33/00* | (2006.01) |
| *H01L 43/08* | (2006.01) |
| *H01L 27/22* | (2006.01) |
| *B82Y 25/00* | (2011.01) |

(52) U.S. Cl.
CPC ....... *G01R 33/093* (2013.01); *G01R 33/0005* (2013.01); *G01R 33/0206* (2013.01); *H01L 27/22* (2013.01); *H01L 43/08* (2013.01); *B82Y 25/00* (2013.01)

(58) Field of Classification Search
CPC .............. G01R 33/093; G01R 33/0005; G01R 33/0206; H01L 27/22; H01L 43/08; B82Y 25/00

USPC ......................................................... 324/252
See application file for complete search history.

(56) References Cited

U.S. PATENT DOCUMENTS

| | | | |
|---|---|---|---|
| 9,530,957 B2 | 12/2016 | Sugihara et al. | |
| 2002/0039264 A1 | 4/2002 | Ohsawa et al. | |
| 2002/0067581 A1* | 6/2002 | Hiramoto ............. | G01R 33/098 360/322 |
| 2004/0239321 A1 | 12/2004 | Kobayashi et al. | |
| 2006/0226835 A1 | 10/2006 | Kobayashi et al. | |
| 2011/0074406 A1 | 3/2011 | Mather et al. | |
| 2016/0320462 A1* | 11/2016 | Mather ................ | G01R 33/098 |

* cited by examiner

*Primary Examiner* — Melissa J Koval
*Assistant Examiner* — Rahul Maini
(74) *Attorney, Agent, or Firm* — Oliff PLC

(57) ABSTRACT

A magnetic sensor includes first and second yokes, first and second magnetoresistive elements, and a current path for passing a current through the first and second magnetoresistive elements. Each of the first and second yokes receives an input magnetic field containing an input magnetic field component in a direction parallel to a first virtual straight line Lz, and generates an output magnetic field. The output magnetic field contains an output magnetic field component in a direction parallel to a second virtual straight line Lx orthogonal to the first virtual straight line Lz. The first and second magnetoresistive elements generate respective detection values corresponding to the output magnetic field components of the output magnetic fields generates by the first and second yokes. The first and second yokes are electrically continuous with the first and second magnetoresistive elements, respectively.

11 Claims, 21 Drawing Sheets

MAGNETIC SENSOR

BACKGROUND OF THE INVENTION

1. Field of the Invention

The present invention relates to a magnetic sensor capable of detecting, through the use of a magnetic detection element, a magnetic field in a direction other than a direction to which the magnetic detection element has sensitivity.

2. Description of the Related Art

Nowadays, some mobile telecommunication devices such as mobile phones may be configured with geomagnetic sensors. It is required of the geomagnetic sensors intended for such use to be small in size and capable of detecting three-dimensional directions of an external magnetic field. Such geomagnetic sensors are implemented using magnetic sensors, for example. Magnetic sensors provided with a plurality of magnetic detection elements on a substrate are known. The magnetic detection elements may be magnetoresistive elements, for example.

In many cases, the magnetic detection elements provided on a substrate are configured to detect a magnetic field in a direction parallel to the plane of the substrate. To implement a geomagnetic sensor using a magnetic sensor, the magnetic sensor needs to be capable of detecting a magnetic field in a direction perpendicular to the plane of the substrate.

U.S. Pat. No. 9,530,957 B2 discloses a magnetic sensor capable of detecting a magnetic field in a direction perpendicular to the plane of a substrate by using a magnetoresistive element configured to detect a magnetic field in a direction parallel to the plane of the substrate. The magnetic sensor includes a soft magnetic material for converting a vertical magnetic field component perpendicular to the plane of the substrate into a horizontal magnetic field component parallel to the plane of the substrate, and supplying the horizontal magnetic field component to the magnetoresistive element.

The magnetic sensor including a magnetoresistive element requires a current path for passing a current through the magnetoresistive element.

In the conventional magnetic sensor including a magnetoresistive element and a soft magnetic material for converting the vertical magnetic field component into the horizontal magnetic field component, such as the magnetic sensor disclosed in U.S. Pat. No. 9,530,957 B2, the soft magnetic material is insulated from the magnetoresistive element and the current path. Disadvantageously, such a magnetic sensor is complicated in configuration and requires a large number of manufacturing steps in order to achieve the structure in which the soft magnetic material is insulated from the magnetoresistive element and the current path.

SUMMARY OF THE INVENTION

It is an object of the present invention to provide a magnetic sensor including a magnetic detection element that is configured to be energized to detect a magnetic field, the magnetic sensor being simple in configuration and capable of detecting a magnetic field in a direction other than a direction to which the magnetic detection element has sensitivity.

A magnetic sensor of the present invention includes: at least one yoke formed of a soft magnetic material; at least one magnetic detection element; and a current path for passing a current through the at least one magnetic detection element. The at least one yoke is configured to receive an input magnetic field and to generate an output magnetic field, the input magnetic field containing an input magnetic field component in a direction parallel to a first virtual straight line. The output magnetic field contains an output magnetic field component in a direction parallel to a second virtual straight line intersecting the first virtual straight line. The output magnetic field component varies depending on the input magnetic field component. The at least one magnetic detection element is configured to be energized by the current path, to receive the output magnetic field and to generate a detection value corresponding to the output magnetic field component. The at least one yoke is electrically continuous with the at least one magnetic detection element.

In the magnetic sensor of the present invention, the second virtual straight line may be orthogonal to the first virtual straight line.

In the magnetic sensor of the present invention, the at least one yoke may constitute at least part of the current path. The at least one yoke may be in contact with the at least one magnetic detection element.

The magnetic sensor of the present invention may further include at least one conductive layer formed of a nonmagnetic conductive material and connecting the at least one yoke and the at least one magnetic detection element.

In the magnetic sensor of the present invention, the at least one magnetic detection element may be at least one magnetoresistive element. The at least one magnetoresistive element may include a magnetization pinned layer having a magnetization in a fixed direction, a free layer having a magnetization in a variable direction, and a gap layer located between the magnetization pinned layer and the free layer. The magnetization pinned layer, the gap layer and the free layer may be stacked in a direction parallel to the first virtual straight line. In the at least one magnetoresistive element, the current may pass through at least the free layer. Alternatively, the current may pass through the magnetization pinned layer, the gap layer and the free layer. In such a case, a portion of the at least one yoke may also serve as the free layer of the at least one magnetoresistive element.

The magnetic sensor of the present invention may further include a power supply port, a ground port, and an output port. The at least one yoke may be a first yoke and a second yoke. The at least one magnetic detection element may be at least one first magnetoresistive element and at least one second magnetoresistive element. The at least one first magnetoresistive element is provided between the power supply port and the output port. The at least one second magnetoresistive element is provided between the ground port and the output port. The current path may include a first portion connecting the power supply port and the at least one first magnetoresistive element, and a second portion connecting the ground port and the at least one second magnetoresistive element.

The first yoke is configured to generate a first output magnetic field containing a first output magnetic field component in a first direction. The second yoke is configured to generate a second output magnetic field containing a second output magnetic field component in a second direction opposite to the first direction. The at least one first magnetoresistive element is configured to receive the first output magnetic field and to generate a first resistance value, the first resistance value being a detection value corresponding to the first output magnetic field component. The at least one second magnetoresistive element is configured to receive the second output magnetic field and to generate a second resistance value, the second resistance value being a detection value corresponding to the second output magnetic field component. One of the first and second resistance values increases whereas the other decreases in response to a change in the input magnetic field component. The output port has an electric potential dependent on the input magnetic field component.

The at least one first magnetoresistive element and the at least one second magnetoresistive element may each include a magnetization pinned layer having a magnetization in a fixed direction, a free layer having a magnetization in a variable direction, and a gap layer located between the magnetization pinned layer and the free layer. The magnetization pinned layer, the gap layer and the free layer may be stacked in a direction parallel to the first virtual straight line.

The at least one first magnetoresistive element and the at least one second magnetoresistive element may be connected to each other. In each of the at least one first magnetoresistive element and the at least one second magnetoresistive element, the current may pass through at least the free layer.

Alternatively, in each of the at least one first magnetoresistive element and the at least one second magnetoresistive element, the current may pass through the magnetization pinned layer, the gap layer and the free layer.

The first yoke may constitute at least part of the first portion of the current path, and the second yoke may constitute at least part of the second portion of the current path.

The first yoke may be in contact with the at least one first magnetoresistive element, and the second yoke may be in contact with the at least one second magnetoresistive element.

The first portion of the current path may include a first conductive layer formed of a nonmagnetic conductive material. The second portion of the current path may include a second conductive layer formed of a nonmagnetic conductive material.

In the magnetic sensor of the present invention, the at least one yoke is electrically continuous with the at least one magnetic detection element. This eliminates the need for a structure in which the at least one yoke is insulated from the at least one magnetic detection element. The present invention thus provides a magnetic sensor including a magnetic detection element configured to be energized to detect a magnetic field, the magnetic sensor being simple in configuration and capable of detecting a magnetic field in a direction other than a direction to which the magnetic detection element has sensitivity.

Other and further objects, features and advantages of the present invention will appear more fully from the following description.

DETAILED DESCRIPTION OF THE PREFERRED EMBODIMENTS

First Embodiment

Figure 1:
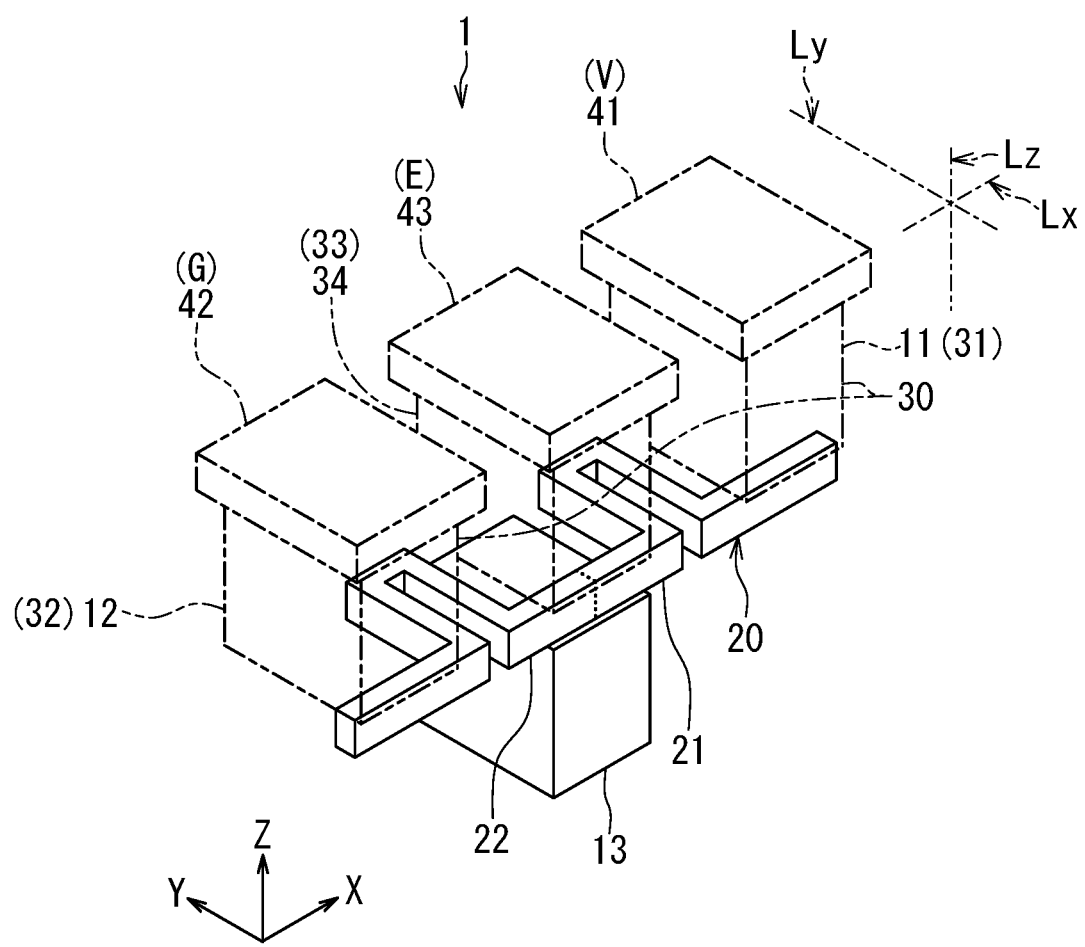
FIG. 1 is a perspective view of a magnetic sensor according to a first embodiment of the invention.
Figure 2:
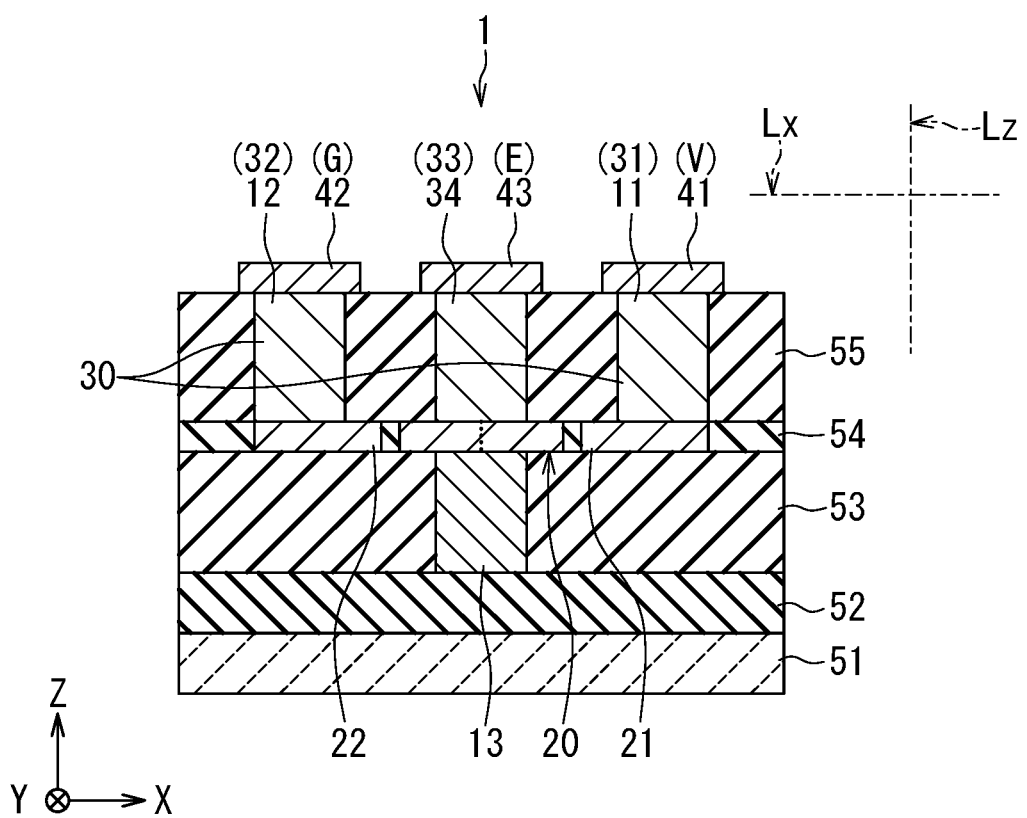
FIG. 2 is a cross-sectional view of the magnetic sensor according to the first embodiment of the invention.
Figure 3:
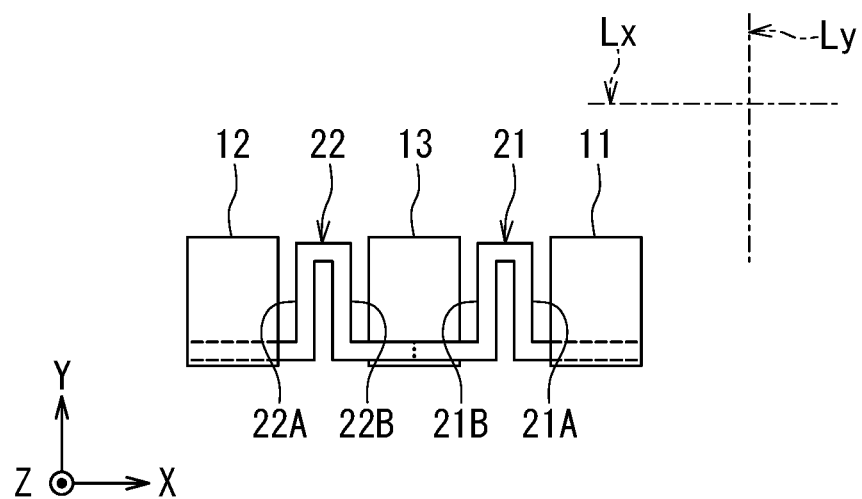
FIG. 3 is a plan view illustrating first to third yokes and first and second magnetoresistive elements of the first embodiment of the invention.

Preferred embodiments of the present invention will now be described in detail with reference to the drawings. First, reference is made to FIG. 1 to FIG. 3 to describe the configuration of a magnetic sensor according to a first embodiment of the invention. FIG. 1 is a perspective view of the magnetic sensor 1. FIG. 2 is a cross-sectional view of the magnetic sensor 1. FIG. 3 is a plan view illustrating first to third yokes and first and second magnetoresistive elements of the first embodiment. The magnetic sensor 1 includes at least one yoke formed of a soft magnetic material, at least one magnetic detection element, and a current path 30 for passing a current through the at least one magnetic detection element.

Now, we define X, Y and Z directions as shown in FIG. 1. The X, Y and Z directions are orthogonal to one another. Further, −X, −Y, and −Z directions refer to directions that are opposite to the X, Y, and Z directions, respectively. As used herein, the term "above" refers to positions located forward of a reference position in the Z direction, and "below" refers to positions located on a side of the reference position opposite to "above". For each component of the magnetic sensor 1, the term "top surface" as used herein refers to a surface of the component lying at the end thereof in the Z direction, and "bottom surface" refers to a surface of the component lying at the end thereof in the −Z direction.

Further, we define a first virtual straight line Lz, a second virtual straight line Lx, and a third virtual straight line Ly as follows. As shown in FIG. 1 and FIG. 2, the first virtual straight line Lz is a straight line parallel to the Z direction. The second virtual straight line Lx is a straight line intersecting the first virtual straight line Lz. In the present embodiment, as shown in FIG. 1 and FIG. 2, the second virtual straight line Lx is orthogonal to the first virtual straight line Lz and parallel to the X direction. As shown in FIG. 1 and FIG. 3, the third virtual straight line Ly is a straight line parallel to the Y direction.

Directions parallel to the first virtual straight line Lz include the Z direction and the −Z direction. Directions parallel to the second virtual straight line Lx include the X direction and the −X direction. Directions parallel to the third virtual straight line Ly include the Y direction and the −Y direction.

The at least one yoke is configured to receive an input magnetic field and to generate an output magnetic field. The input magnetic field contains an input magnetic field component in a direction parallel to the first virtual straight line Lz. The output magnetic field contains an output magnetic field component in a direction parallel to the second virtual straight line Lx. The output magnetic field component varies depending on the input magnetic field component. The at least one yoke is electrically continuous with the at least one magnetic detection element.

In the present embodiment, the at least one yoke is a first yoke 11 and a second yoke 12, in particular. The first yoke 11 is configured to receive the input magnetic field and to generate a first output magnetic field, the first output magnetic field containing a first output magnetic field component in a first direction parallel to the second virtual straight line Lx. The second yoke 12 is configured to receive the input magnetic field and to generate a second output magnetic field, the second output magnetic field containing a second output magnetic field component in a second direction opposite to the first direction. The first and second yokes 11 and 12 are each in the shape of a rectangular solid, for example.

The magnetic sensor 1 further includes a third yoke 13 formed of a soft magnetic material. The first output magnetic field component develops between the first yoke 11 and the third yoke 13. The second output magnetic field component develops between the second yoke 12 and the third yoke 13. The third yoke 13 is in the shape of a rectangular solid, for example. The third yoke 13 is not an essential component of the magnetic sensor 1 and can thus be omitted.

The at least one magnetic detection element is configured to be energized by the current path 30, to receive the output magnetic field, and to generate a detection value corresponding to the output magnetic field component. In the present embodiment, the at least one magnetic detection element is a first magnetoresistive element 21 and a second magnetoresistive element 22, in particular. As will be described in detail later, each of the first and second magnetoresistive elements 21 and 22 includes a plurality of layers stacked together. The magnetic sensor 1 includes a layered structure 20 including the aforementioned plurality of layers. The first and second magnetoresistive elements 21 and 22 are connected to each other. In FIG. 1 to FIG. 3, the boundary between the first magnetoresistive element 21 and the second magnetoresistive element 22 is indicated in a dotted line.

The first to third yokes 11 to 13 are aligned in the −X direction in the order of the first yoke 11, the third yoke 13, and the second yoke 12. The first yoke 11 and the second yoke 12 are disposed on top of the layered structure 20. The third yoke 13 is disposed below the layered structure 20. The first magnetoresistive element 21 is disposed to intersect a YZ plane that passes between the first yoke 11 and the third yoke 13. The second magnetoresistive element 22 is disposed to intersect a YZ plane that passes between the second yoke 12 and the third yoke 13.

The first magnetoresistive element 21 is configured to receive the first output magnetic field and to generate a first resistance value, the first resistance value being a detection value corresponding to the first output magnetic field component. The second magnetoresistive element 22 is configured to receive the second output magnetic field and to generate a second resistance value, the second resistance value being a detection value corresponding to the second output magnetic field component.

The magnetic sensor 1 further includes a conductive layer 34 and terminals 41, 42 and 43 each formed of a nonmagnetic conductive material, a substrate 51 formed of a non-magnetic material, and insulating layers 52, 53, 54 and 55 each formed of an insulating material. The insulating layer 52 lies on the substrate 51. The third yoke 13 lies on the insulating layer 52. The insulating layer 53 lies on the insulating layer 52 and surrounds the third yoke 13. The layered structure 20 lies on the third yoke 13 and the insulating layer 53. The third yoke 13 is located near the boundary between the first and second magnetoresistive elements 21 and 22 and in contact with the first and second magnetoresistive elements 21 and 22. The insulating layer 54 lies on the third yoke 13 and the insulating layer 53 and surrounds the layered structure 20.

The first yoke 11 lies on the first magnetoresistive element 21 and the insulating layer 54. The first yoke 11 is in contact with a portion of the first magnetoresistive element 21 near an end thereof opposite to the boundary with the second magnetoresistive element 22.

The second yoke 12 lies on the second magnetoresistive element 22 and the insulating layer 54. The second yoke 12 is in contact with a portion of the second magnetoresistive element 22 near an end thereof opposite to the boundary with the first magnetoresistive element 21.

The conductive layer 34 lies on the first magnetoresistive element 21, the second magnetoresistive element 22 and the insulating layer 54. The conductive layer 34 is in contact with portions of the first and second magnetoresistive elements 21 and 22 near the boundary therebetween in the layered structure 20. The conductive layer 34 is in the shape of a rectangular solid, for example.

The insulating layer 55 lies on the layered structure 20 and the insulating layer 54 and surrounds the first yoke 11, the second yoke 12 and the conductive layer 34. The terminal 41 lies on the first yoke 11 and the insulating layer 55, and is in contact with the first yoke 11. The terminal 42 lies on the second yoke 12 and the insulating layer 55, and is in contact with the second yoke 12. The terminal 43 lies on the conductive layer 34 and the insulating layer 55, and is in contact with the conductive layer 34.

Figure 5:
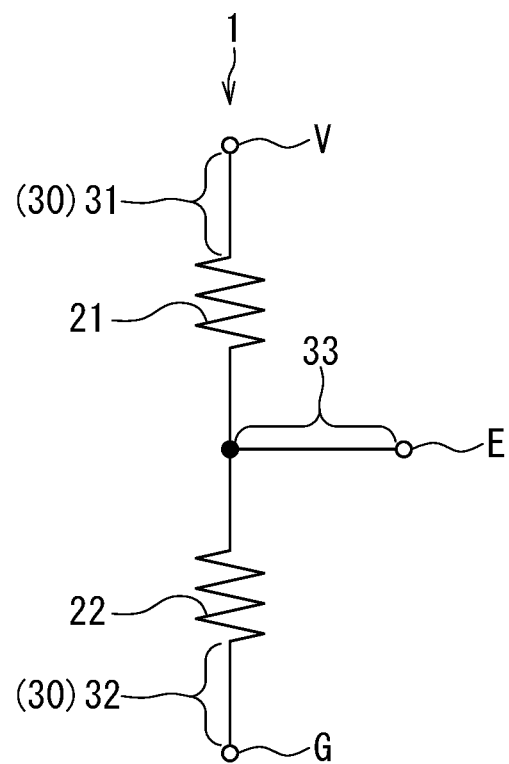
FIG. 5 is a circuit diagram illustrating a circuit configuration of the magnetic sensor according to the first embodiment of the invention.

Reference is now made to FIG. 5 to describe the circuit configuration of the magnetic sensor 1. FIG. 5 is a circuit diagram illustrating the circuit configuration of the magnetic sensor 1. The magnetic sensor 1 includes a power supply port V, a ground port and an output port E. The terminals 41, 42 and 43 shown in FIG. 1 and FIG. 2 correspond to the power supply port V, the ground port G and the output port E, respectively. The first magnetoresistive element 21 is provided between the power supply port V and the output port E. The second magnetoresistive element 22 is provided between the ground port G and the output port E.

The magnetic sensor 1 further includes a signal line 33 for connecting the connection point between the first and second magnetoresistive elements 21 and 22 to the output port E. In the present embodiment, the signal line 33 is formed of the conductive layer 34 (see FIG. 1 and FIG. 2).

The configuration of the current path 30 will now be described in detail with reference to FIG. 1, FIG. 2 and FIG. 5. The current path 30 includes a first portion 31 and a second portion 32. The first portion 31 connects the power supply port V and the first magnetoresistive element 21. The second portion 32 connects the ground port G and the second magnetoresistive element 22.

The first yoke 11 is electrically continuous with the first magnetoresistive element 21, and constitutes at least part of the first portion 31. In the present embodiment, as shown in FIG. 1 and FIG. 2, the first yoke 11 is in contact with the first magnetoresistive element 21 and the terminal 41, and constitutes the entirety of the first portion 31.

The second yoke 12 is electrically continuous with the second magnetoresistive element 22, and constitutes at least part of the second portion 32. In the present embodiment, as shown in FIG. 1 and FIG. 2, the second yoke 12 is in contact with the second magnetoresistive element 22 and the terminal 42, and constitutes the entirety of the second portion 32.

The configuration of the first and second magnetoresistive elements 21 and 22 will now be described in detail with reference to FIG. 1 to FIG. 5. As shown in FIG. 3, the first magnetoresistive element 21 includes a first detection portion 21A and a second detection portion 21B connected in series. The first and second detection portions 21A and 21B are formed of portions of the first magnetoresistive element 21 that are in contact with none of the first yoke 11, the third yoke 13 and the conductive layer 34. Each of the first and second detection portions 21A and 21B is shaped to be elongated in a direction parallel to the third virtual straight line Ly. One end of the first detection portion 21A is electrically connected to the power supply port V, and the other end of the first detection portion 21A is electrically connected to one end of the second detection portion 21B. The other end of the second detection portion 21B is electrically connected to the output port E.

As shown in FIG. 3, the second magnetoresistive element 22 includes a third detection portion 22A and a fourth detection portion 22B connected in series. The third and fourth detection portions 22A and 22B are formed of portions of the second magnetoresistive element 22 that are in contact with none of the second yoke 12, the third yoke 13 and the conductive layer 34. Each of the third and fourth detection portions 22A and 22B is shaped to be elongated in a direction parallel to the third virtual straight line Ly. One end of the third detection portion 22A is electrically connected to the ground port G and the other end of the third detection portion 22A is electrically connected to one end of the fourth detection portion 22B. The other end of the fourth detection portion 22B is electrically connected to the output port E.

Each of the first to third yokes 11 to 13 has a first end face lying at the end in the Y direction, and a second end face lying at the end in the −Y direction. In the present embodiment, the first end faces of the first to third yokes 11 to 13 are located in one first virtual plane parallel to the XZ plane, and the second end faces of the first to third yokes 11 to 13 are located in one virtual second plane parallel to the XZ plane. The first to fourth detection portions 21A, 21B, 22A and 22B are located between the first virtual plane and the second virtual plane.

Figure 4:
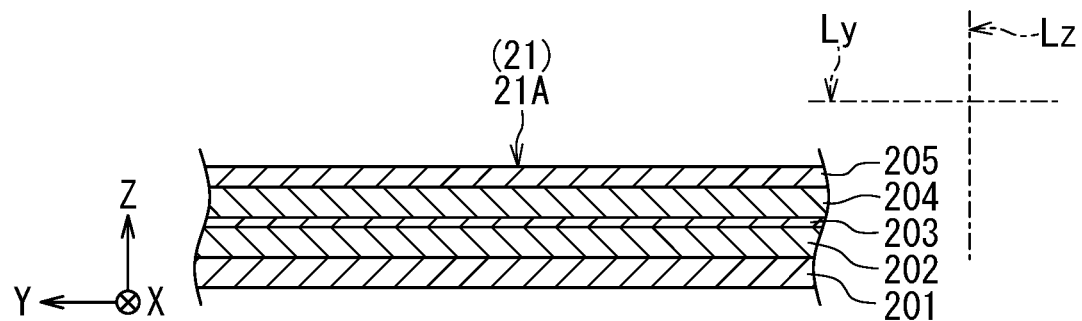
FIG. 4 is a cross-sectional view of part of the first magnetoresistive element of the first embodiment of the invention.

FIG. 4 is a cross-sectional view of the first detection portion 21A, which is part of the first magnetoresistive element 21. The first detection portion 21A includes a magnetization pinned layer 202 having a magnetization in a fixed direction, a free layer 204 having a magnetization in a variable direction, and a gap layer 203 located between the magnetization pinned layer 202 and the free layer 204.

In the example shown in FIG. 4, the first detection portion 21A further includes an antiferromagnetic layer 201 and a protective layer 205. The antiferromagnetic layer 201, the magnetization pinned layer 202, the gap layer 203, the free layer 204, and the protective layer 205 are stacked in this order in a direction parallel to the first virtual straight line Lz, the antiferromagnetic layer 201 being closest to the substrate 51 (see FIG. 2). The antiferromagnetic layer 201 is formed of an antiferromagnetic material and is in exchange coupling with the magnetization pinned layer 202 to fix the magnetization direction of the magnetization pinned layer 202. The protective layer 205 is to protect the free layer 204 located thereunder.

The second to fourth detection portions 21B, 22A and 22B each have the same configuration as that of the first detection portion 21A. Thus, in the following description, components of the second to fourth detection portions 21B, 22A and 22B are denoted by the same reference signs as those used for the components of the first detection portion 21A. Each of the first and second detection portions 21A and 21B is part of the first magnetoresistive element 21, and each of the third and fourth detection portions 22A and 22B is part of the second magnetoresistive element 22; therefore one can say that each of the first and second magnetoresistive elements 21 and 22 includes the antiferromagnetic layer 201, the magnetization pinned layer 202, the gap layer 203, the free layer 204 and the protective layer 205.

In the present embodiment, the first and second magnetoresistive elements 21 and 22 are giant magnetoresistive (GMR) elements, particularly GMR elements of the current-in-plane (CIP) type in which a current is fed in a direction substantially parallel to the plane of the layers constituting the GMR elements. In each of the first and second magnetoresistive elements 21 and 22, the current passes through at least the free layer 204. In the present embodiment, the gap layer 203 is a nonmagnetic conductive layer.

The first resistance value of the first magnetoresistive element 21 varies depending on the resistance value of each of the first and second detection portions 21A and 21B. The second resistance value of the second magnetoresistive element 22 varies depending on the resistance value of each of the third and fourth detection portions 22A and 22B. The resistance value of each of the first to fourth detection portions 21A, 21B, 22A and 22B varies depending on the angle that the magnetization direction of the free layer 204 forms with the magnetization direction of the magnetization pinned layer 202, and is minimized when the foregoing angle is 0°, and maximized when the foregoing angle is 180°.

Figure 16:
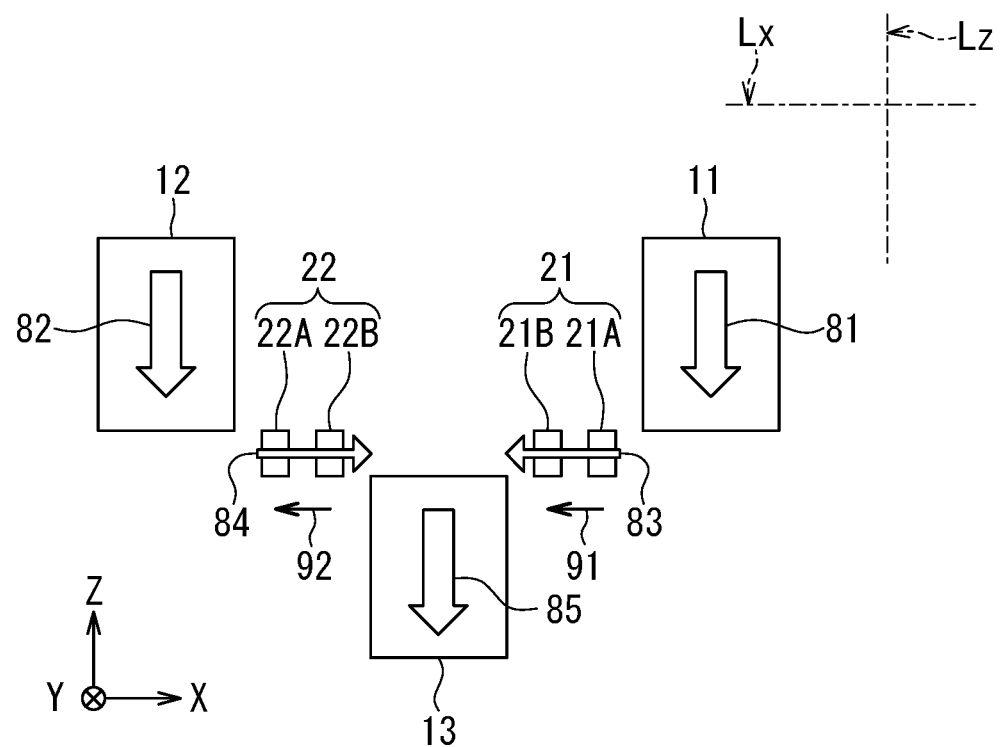
FIG. 16 is an explanatory diagram for explaining the operation of the magnetic sensor according to the first embodiment of the invention.
Figure 17:
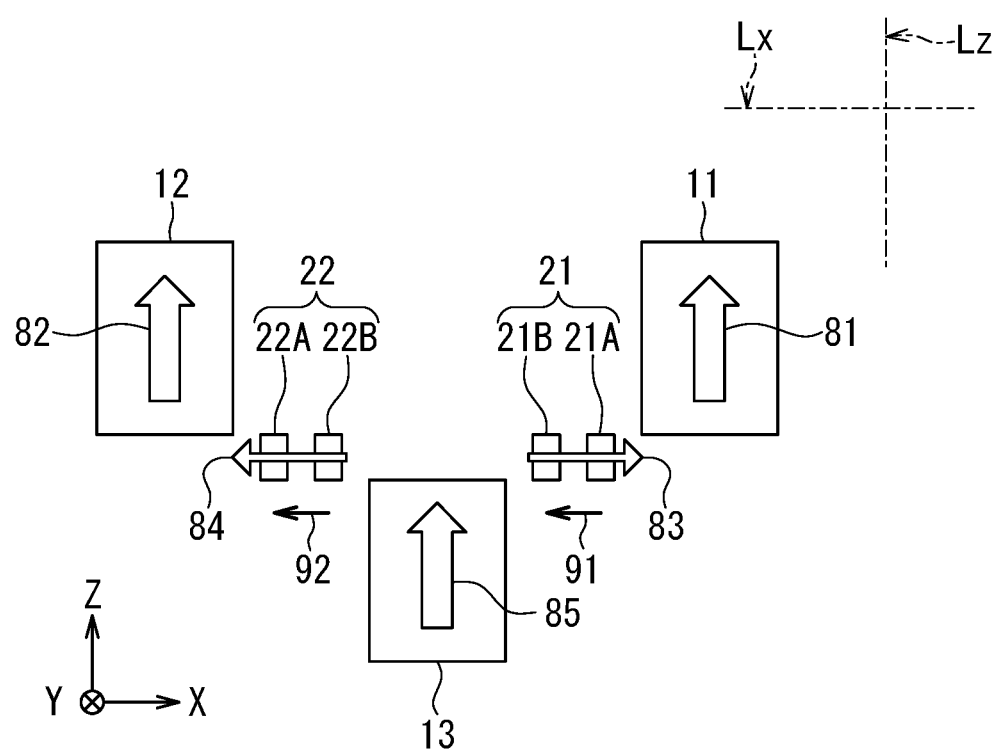
FIG. 17 is an explanatory diagram for explaining the operation of the magnetic sensor according to the first embodiment of the invention.

The magnetization pinned layers 202 in the first magnetoresistive element 21 and those in the second magnetoresistive element 22 have the same magnetization direction. In the present embodiment, their magnetization direction is the −X direction. FIG. 16 and FIG. 17, which will be described later, illustrate their magnetization direction.

As mentioned previously, each of the first and second detection portions 21A and 21B is shaped to be elongated in a direction parallel to the third virtual straight line Ly. This causes the free layer 204 of each of the first and second detection portions 21A and 21B to have a shape anisotropy that establishes an easy axis direction parallel to the third virtual straight line Ly. Thus, when there is no first output magnetic field component, the magnetization direction of the free layer 204 is parallel to the third virtual straight line Ly. When the first output magnetic field component is present, the magnetization direction of the free layer 204 varies depending on the direction and strength of the first output magnetic field component. Thus, in each of the first and second detection portions 21A and 21B, the angle that the magnetization direction of the free layer 204 forms with the magnetization direction of the magnetization pinned layer 202 varies depending on the direction and strength of the first output magnetic field component received by the detection portion. The resistance value of each of the first and second detection portions 21A and 21B and the first resistance value of the first magnetoresistive element 21 thus correspond to the first output magnetic field component.

Likewise, each of the third and fourth detection portions 22A and 22B is shaped to be elongated in a direction parallel to the third virtual straight line Ly. This causes the free layer 204 of each of the third and fourth detection portions 22A and 22B to have a shape anisotropy that establishes an easy axis direction parallel to the third virtual straight line Ly. Thus, when there is no second output magnetic field component, the magnetization direction of the free layer 204 is parallel to the third virtual straight line Ly. When the second output magnetic field component is present, the magnetization direction of the free layer 204 varies depending on the direction and strength of the second output magnetic field component. Thus, in each of the third and fourth detection portions 22A and 22B, the angle that the magnetization direction of the free layer 204 forms with the magnetization direction of the magnetization pinned layer 202 varies depending on the direction and strength of the second output magnetic field component received by the detection portion. The resistance value of each of the third and fourth detection portions 22A and 22B and the second resistance value of the second magnetoresistive element 22 thus correspond to the second output magnetic field component.

Figure 6:
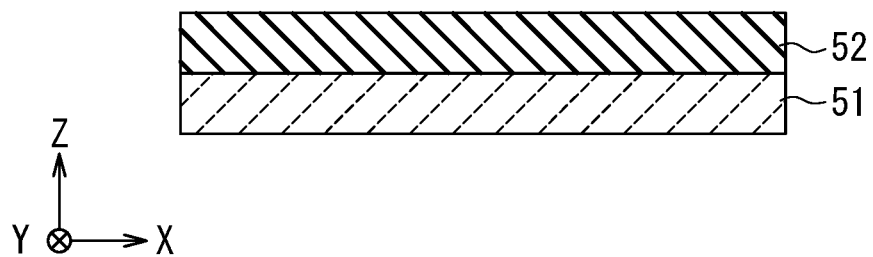
FIG. 6 is a cross-sectional view illustrating a step of a manufacturing method for the magnetic sensor according to the first embodiment of the invention.
Figure 7:
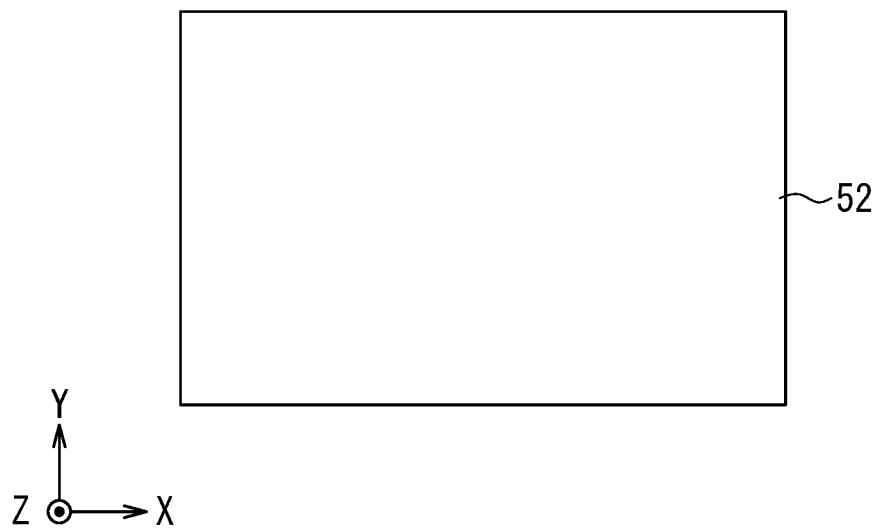
FIG. 7 is a plan view illustrating the step of FIG. 6.

Now, a manufacturing method for the magnetic sensor 1 according to the present embodiment will be described with reference to FIG. 6 to FIG. 15. FIG. 6 and FIG. 7 illustrate a step of the manufacturing method for the magnetic sensor 1 according to the present embodiment. In this step, the insulating layer 52 is formed on the substrate 51.

Figure 8:
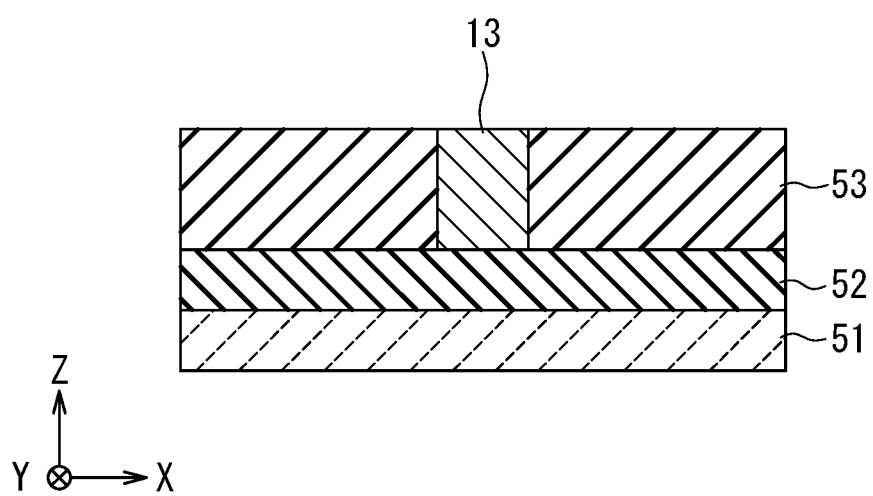
FIG. 8 is a cross-sectional view illustrating a step that follows the step of FIG. 6.
Figure 9:
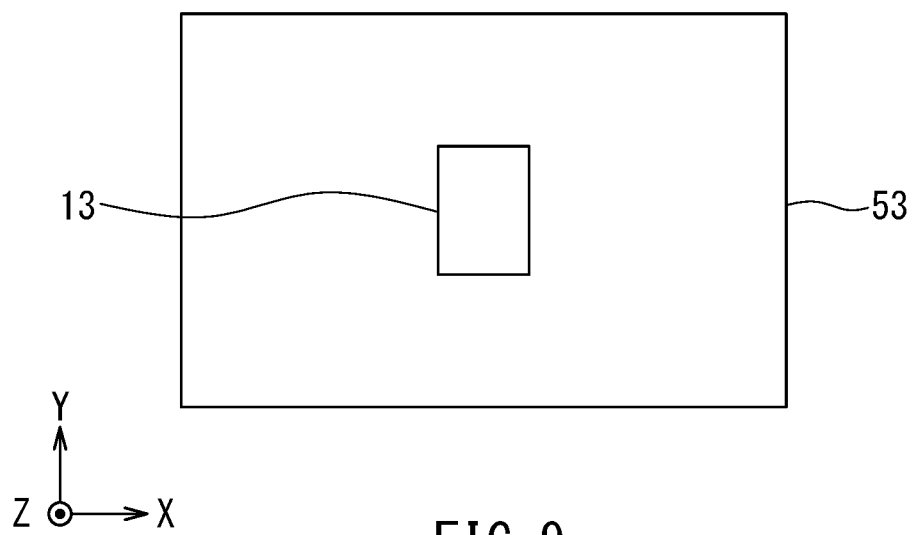
FIG. 9 is a plan view illustrating the step of FIG. 8.

FIG. 8 and FIG. 9 illustrate the next step. In this step, first, the third yoke 13 is formed by plating, for example. Then, the insulating layer 53 is formed to cover the third yoke 13. The insulating layer 53 is then polished by, for example, chemical mechanical polishing (hereinafter referred to as CMP), until the third yoke 13 is exposed.

Figure 10:
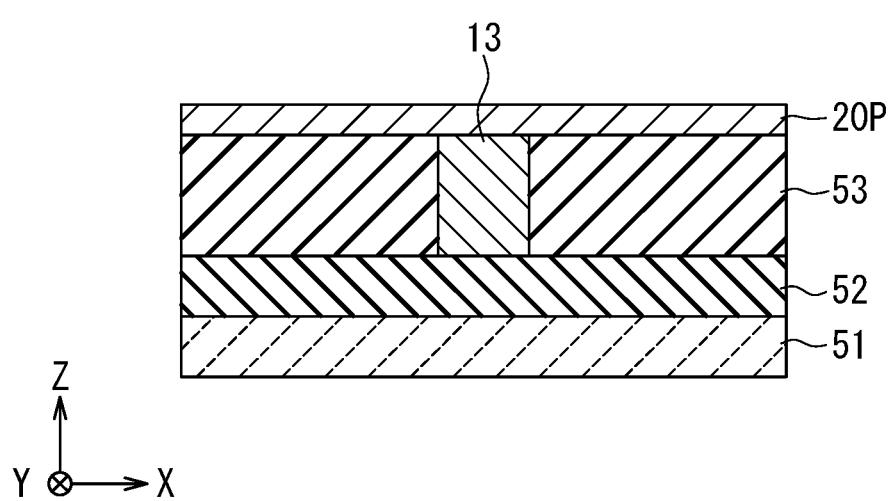
FIG. 10 is a cross-sectional view illustrating a step that follows the step of FIG. 8.
Figure 11:
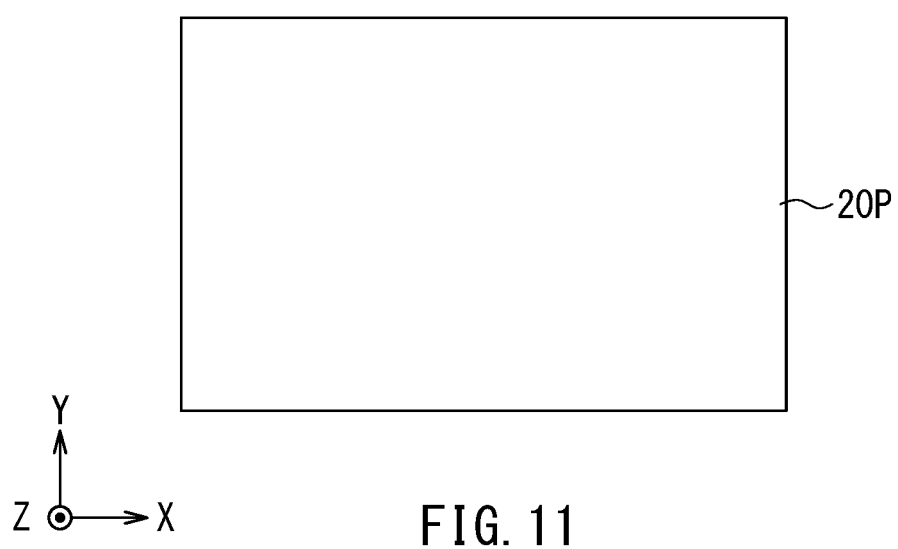
FIG. 11 is a plan view illustrating the step of FIG. 10.

FIG. 10 and FIG. 11 illustrate the next step. In this step, a layered film 20P is formed over the third yoke 13 and the insulating layer 53. The layered film 20P is to be patterned later into the layered structure 20. The layered film 20P is composed of the layers that are to constitute the layered structure 20.

Figure 12:
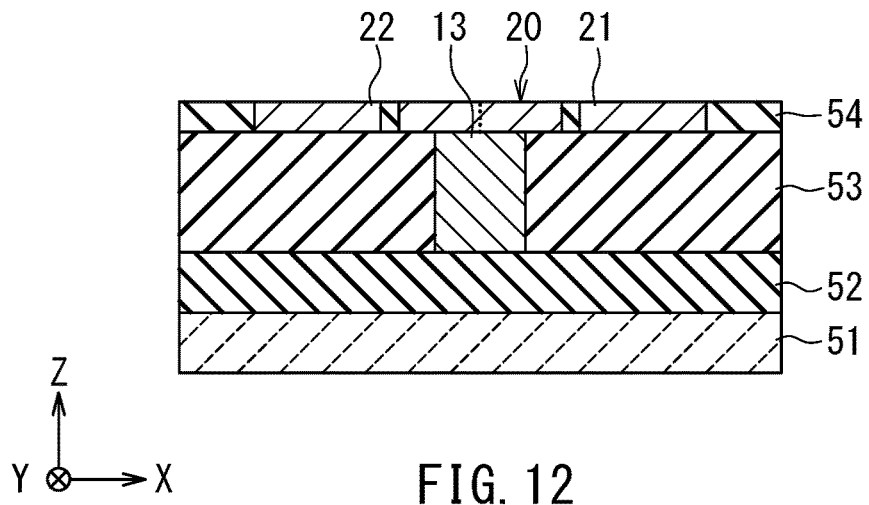
FIG. 12 is a cross-sectional view illustrating a step that follows the step of FIG. 10.
Figure 13:
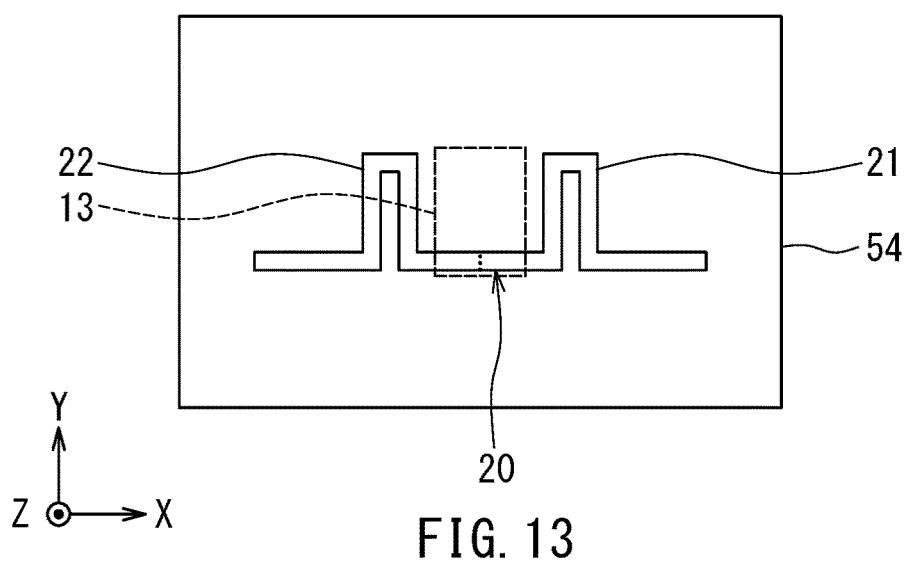
FIG. 13 is a plan view illustrating the step of FIG. 12.

FIG. 12 and FIG. 13 illustrate the next step. In this step, first, a mask (not illustrated) is formed on the layered film 20P. From a plan view, the mask has a shape corresponding to that of the layered structure 20. Then, the layered film 20P is etched using the mask as an etching mask. This makes the layered film 20P into the layered structure 20, thus completing the first and second magnetoresistive elements 21 and 22. The mask is then removed. Next, the insulating layer 54 is formed to cover the layered structure 20. The insulating layer 54 is then polished by, for example, CMP, until the layered structure 20 is exposed.

Figure 14:
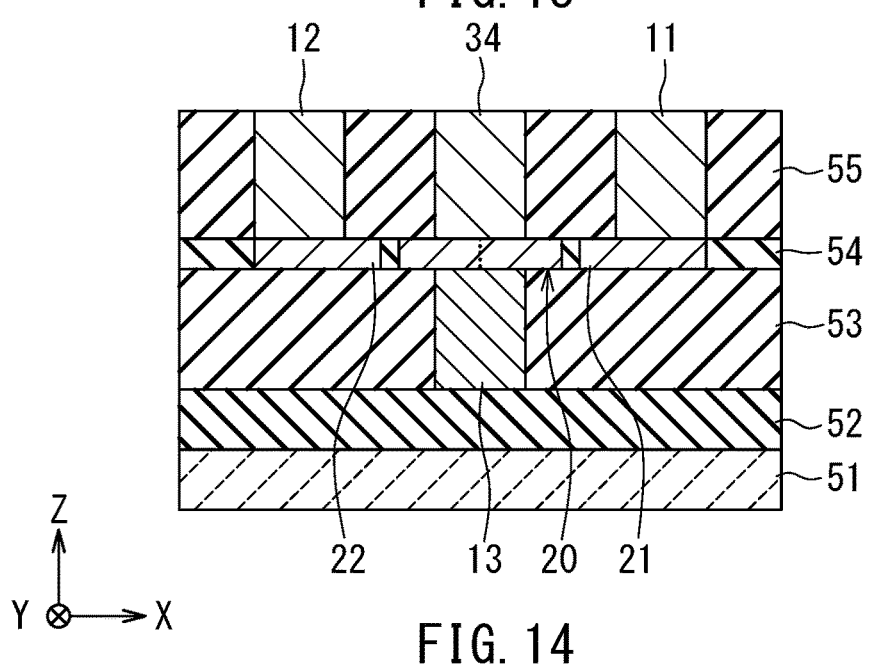
FIG. 14 is a cross-sectional view illustrating a step that follows the step of FIG. 12.
Figure 15:
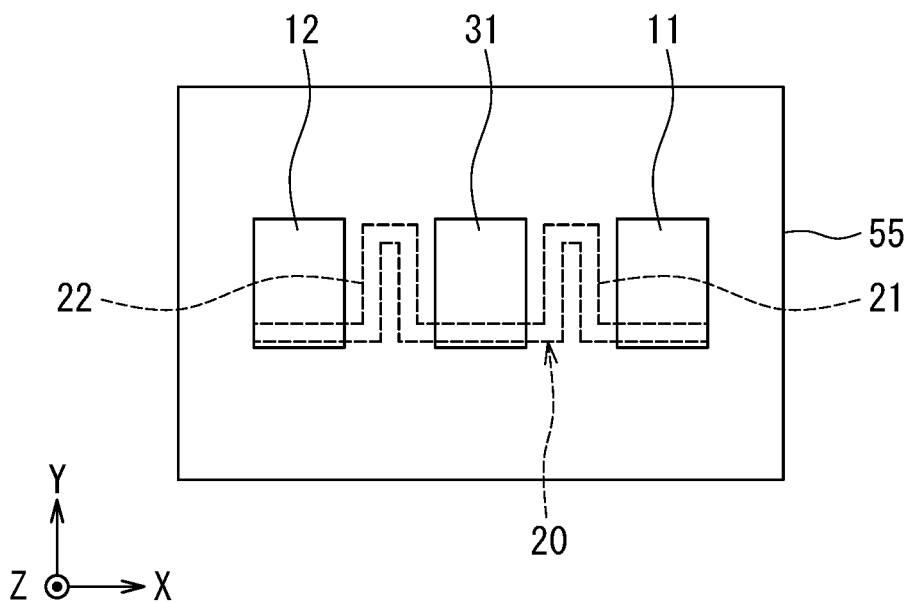
FIG. 15 is a plan view illustrating the step of FIG. 14.

FIG. 14 and FIG. 15 illustrate the next step. In this step, first, the first yoke 11 is formed on the first magnetoresistive element 21 and the insulating layer 54, the second yoke 12 is formed on the second magnetoresistive element 22 and the insulating layer 54, and the conductive layer 34 is formed on the first and second magnetoresistive elements 21 and 22 and the insulating layer 54, by plating, for example. Next, the insulating layer 55 is formed to cover the first yoke 11, the second yoke 12 and the conductive layer 34. The insulating layer 55 is then polished by, for example, CMP, until the first and second yokes 11 and 12 and the conductive layer 34 are exposed. Next, the terminals 41, 42 and 43 shown in FIG. 1 and FIG. 2 are formed by, for example, plating. The magnetic sensor 1 is thereby completed.

The operation of the magnetic sensor 1 will now be described with reference to FIG. 16 and FIG. 17. FIG. 16 and FIG. 17 are explanatory diagrams for explaining the operation of the magnetic sensor 1. FIG. 16 illustrates a case where the input magnetic field component is in the −Z direction, and FIG. 17 illustrates a case where the input magnetic field component is in the Z direction. In FIG. 16 and FIG. 17, the arrow labeled 81 indicates the direction of a magnetic field that occurs in the first yoke 11 in response to the input magnetic field component, and the arrow labeled 82 indicates the direction of a magnetic field that occurs in the second yoke 12 in response to the input magnetic field component. The arrow labeled 83 indicates the first direction, that is, the direction of the first output magnetic field component, and the arrow labeled 84 indicates the second direction, that is, the direction of the second output magnetic field component. The arrow labeled 85 indicates the direction of a magnetic field that occurs in the third yoke layer 13 in response to the input magnetic field component. The arrow labeled 91 indicates the magnetization direction of the magnetization pinned layers 202 in the first magnetoresistive element 21. The arrow labeled 92 indicates the magnetization direction of the magnetization pinned layers 202 in the second magnetoresistive element 22.

In the present embodiment, when the first and second output magnetic field components are absent, the magnetization direction of the free layers 204 in the first and second magnetoresistive elements 21 and 22 is parallel to the third virtual straight line Ly (see FIG. 1 and FIG. 3). When the input magnetic field component is in the −Z direction, as shown in FIG. 16, the first direction (see the arrow 83) or the direction of the first output magnetic field component is the −X direction, whereas the second direction (see the arrow 84) or the direction of the second output magnetic field component is the X direction. This causes the magnetization direction of the free layers 204 in the first magnetoresistive element 21 to become inclined from the direction parallel to the third virtual straight line Ly toward the −X direction, and causes the magnetization direction of the free layers 204 in the second magnetoresistive element 22 to become inclined from the direction parallel to the third virtual straight line Ly toward the X direction. As a result, relative to the case where the first and second output magnetic field components are absent, the first resistance value of the first magnetoresistive element 21 decreases, whereas the second resistance value of the second magnetoresistive element 22 increases.

When the input magnetic field component is in the Z direction, as shown in FIG. 17, the first direction (see the arrow 83) or the direction of the first output magnetic field component is the X direction, whereas the second direction (see the arrow 84) or the direction of the second output magnetic field component is the −X direction. This causes the magnetization direction of the free layers 204 in the first magnetoresistive element 21 to become inclined from the direction parallel to the third virtual straight line Ly toward the X direction, and causes the magnetization direction of the free layers 204 in the second magnetoresistive element 22 to become inclined from the direction parallel to the third virtual straight line Ly toward the −X direction. As a result, relative to the case where the first and second output magnetic field components are absent, the first resistance value of the first magnetoresistive element 21 increases, whereas the second resistance value of the second magnetoresistive element 22 decreases.

The amounts of changes of the first and second resistance values relative to the state where the first and second output magnetic field components are absent depend on the strengths of the first and second output magnetic field components received by the first and second magnetoresistive elements 21 and 22, respectively. The first and second resistance values increase or decrease by a larger amount as the strengths of the first and second output magnetic field components increase. The first and second resistance values increase or decrease by a smaller amount as the strengths of the first and second output magnetic field components decrease. The strengths of the first and second output magnetic field components depend on the strength of the input magnetic field component.

The electric potential at the output port E shown in FIG. 5 depends on the input magnetic field component. More specifically, as described above, one of the first and second resistance values increases whereas the other decreases in response to changes in the direction and strength of the input magnetic field component. This causes a change in the electric potential at the output port E. The magnetic sensor 1 generates a signal that depends on the electric potential at the output port E, as an output signal.

In the present embodiment, the first yoke 11, the third yoke 13 and the conductive layer 34 are in contact with the first magnetoresistive element 21. Hereinafter, a portion of the first magnetoresistive element 21 that is in contact with any of the first yoke 11, the third yoke 13 and the conductive layer 34 will be referred to as the first contact portion, and the other portion of the first magnetoresistive element 21 will be referred to as the first non-contact portion. The first non-contact portion includes the first and second detection portions 21A and 21B. A current passes through the first non-contact portion, whereas substantially no current passes through the first contact portion. Consequently, the amount of change in the resistance value of the first non-contact portion is substantially the amount of change in the first resistance value, and the first contact portion does not contribute to a change in the first resistance value.

Likewise, in the present embodiment, the second yoke 12, the third yoke 13 and the conductive layer 34 are in contact with the second magnetoresistive element 22. Hereinafter, a portion of the second magnetoresistive element 22 that is in contact with any of the second yoke 12, the third yoke 13 and the conductive layer 34 will be referred to as the second contact portion, and the other portion of the second magnetoresistive element 22 will be referred to as the second non-contact portion. The second non-contact portion includes the third and fourth detection portions 22A and 22B. A current passes through the second non-contact portion, whereas substantially no current passes through the second contact portion. Consequently, the amount of change in the resistance value of the second non-contact portion is substantially the amount of change in the second resistance value, and the second contact portion does not contribute to a change in the second resistance value.

The effects of the magnetic sensor 1 according to the present embodiment will now be described. The magnetic sensor 1 according to the present embodiment includes the first and second yokes 11 and 12 as the at least one yoke. The first yoke 11 is configured to receive the input magnetic field containing the input magnetic field component in a direction parallel to the first virtual straight line Lz, and to generate the first output magnetic field containing the first output magnetic field component in the first direction parallel to the second virtual straight line Lx. The second yoke 12 is configured to receive the input magnetic field containing the input magnetic field component in a direction parallel to the first virtual straight line Lz, and to generate the second output magnetic field containing the second output magnetic field component in the second direction opposite to the first direction. The first magnetoresistive element 21 is configured to receive the first output magnetic field and to generate the first resistance value, which is a detection value corresponding to the first output magnetic field component. The second magnetoresistive element 22 is configured to receive the second output magnetic field and to generate the second resistance value, which is a detection value corresponding to the second output magnetic field component. By virtue of the above-described configuration and operation, the present embodiment enables detection of a magnetic field in a direction parallel to the first virtual straight line Lz through the use of the first and second magnetoresistive elements 21 and 22 having sensitivity to a direction parallel to the second virtual straight line Lx.

Further, in the present embodiment, the first yoke 11 is electrically continuous with the first magnetoresistive element 21, and the second yoke 12 is electrically continuous with the second magnetoresistive element 22. Accordingly, the present embodiment does not require a structure in which the first and second yokes 11 and 12 are insulated from the first and second magnetoresistive elements 21 and 22. This eliminates the need for an insulating layer for separating the first and second yokes 11 and 12 from the first and second magnetoresistive elements 21 and 22, and thereby simplifies the configuration of the magnetic sensor 1.

In the present embodiment, the first yoke 11 constitutes at least part of the first portion 31 of the current path 30, and the second yoke 12 constitutes at least part of the second portion 32 of the current path 30. In the present embodiment, in particular, the first yoke 11 constitutes the entirety of the first portion 31, and the second yoke 12 constitutes the entirety of the second portion 32. This makes the configuration of the magnetic sensor 1 simpler than in the case where the first and second yokes 11 and 12 are separate from the current path.

Second Embodiment

Figure 18:
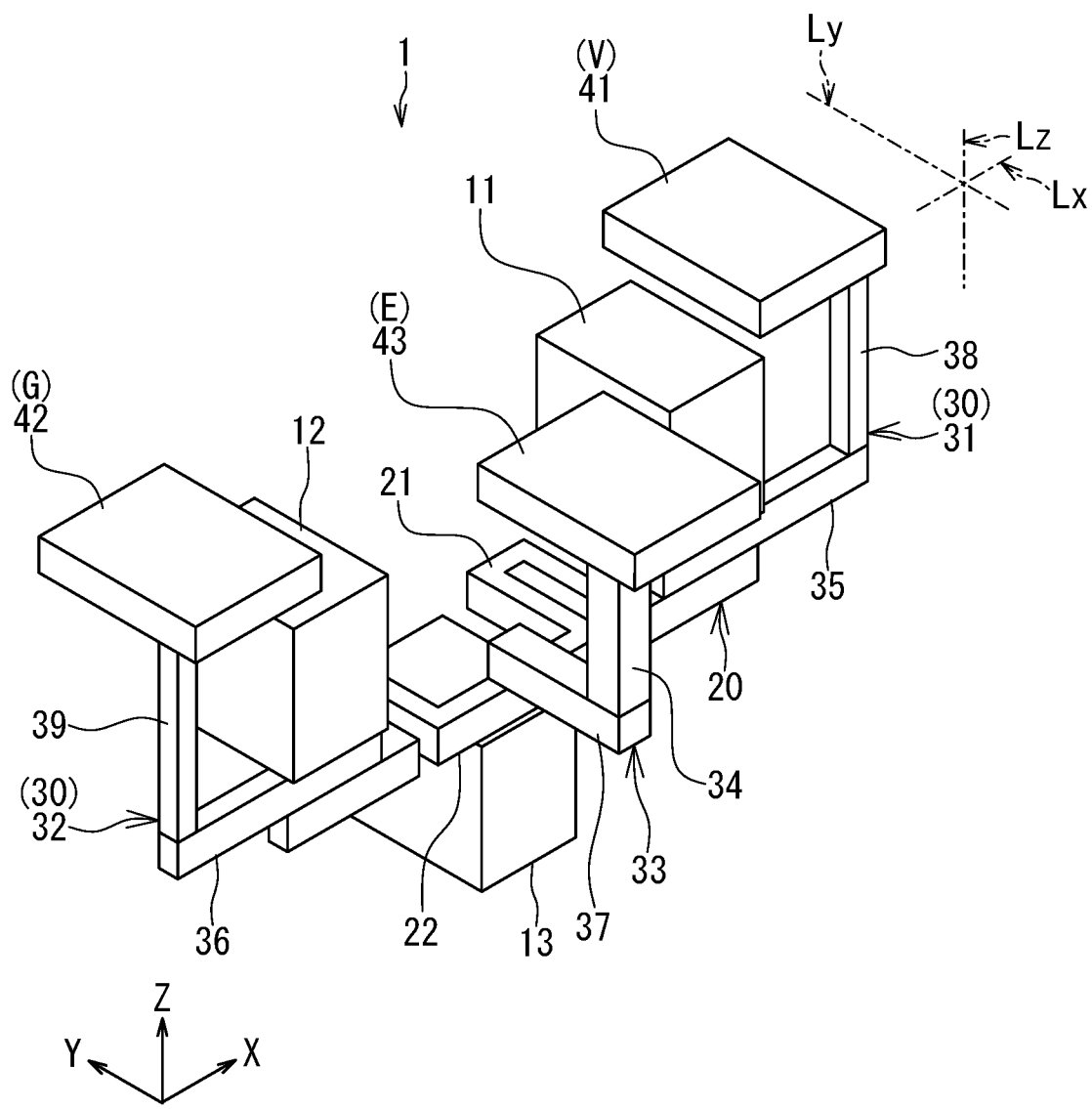
FIG. 18 is a perspective view of a magnetic sensor according to a second embodiment of the invention.
Figure 19:
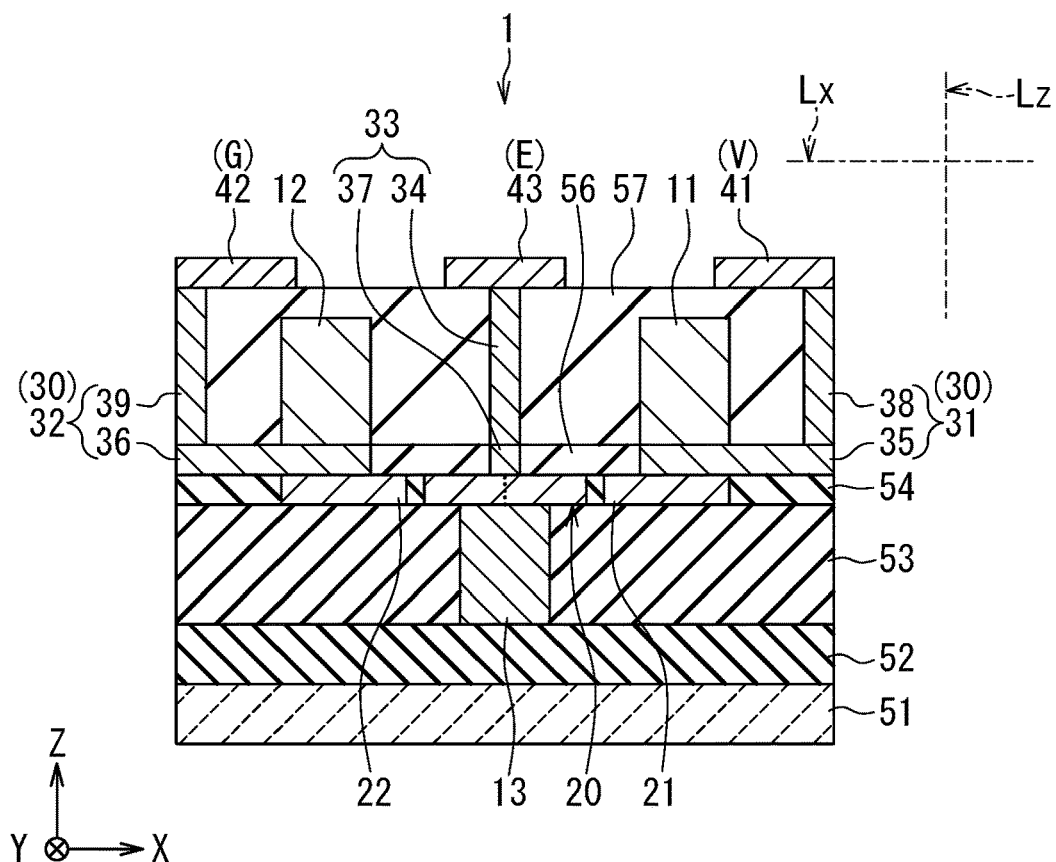
FIG. 19 is a cross-sectional view of the magnetic sensor according to the second embodiment of the invention.
Figure 20:
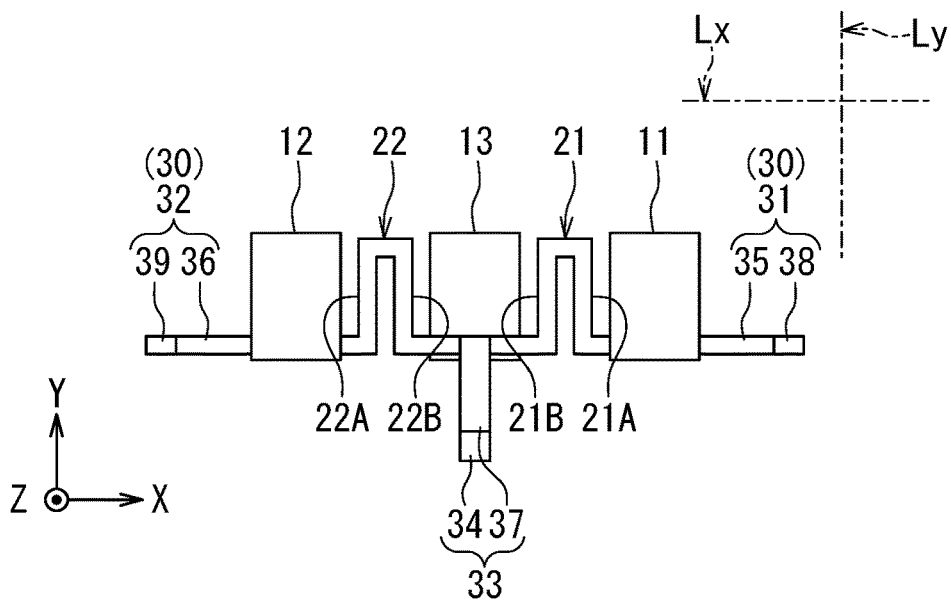
FIG. 20 is a plan view illustrating first to third yokes, first and second magnetoresistive elements, and first and second conductive layers of the second embodiment of the invention.

A second embodiment of the present invention will now be described. First, reference is made to FIG. 18 to FIG. 20 to describe the configuration of a magnetic sensor according to the second embodiment of the invention. FIG. 18 is a perspective view of the magnetic sensor according to the second embodiment. FIG. 19 is a cross-sectional view of the magnetic sensor according to the second embodiment. FIG. 20 is a plan view illustrating first to third yokes, first and second magnetoresistive elements, and first and second conductive layers of the second embodiment.

The magnetic sensor 1 according to the second embodiment differs from the first embodiment in the following ways. The first yoke 11 is not in contact with the first magnetoresistive element 21. The first portion 31 of the current path 30 includes a first conductive layer 35 formed of a nonmagnetic conductive material. The first conductive layer 35 is in contact with a portion of the top surface of the first magnetoresistive element 21 near an end of the first magnetoresistive element 21 opposite to the boundary with the second magnetoresistive element 22, and also in contact with the bottom surface of the first yoke 11. The first conductive layer 35 thereby connects the first yoke 11 and the first magnetoresistive element 21. The first conductive layer 35 is shaped to be elongated in a direction parallel to the second virtual straight line Lx.

The second yoke 12 is not in contact with the second magnetoresistive element 22. The second portion 32 of the current path 30 includes a second conductive layer 36 formed of a nonmagnetic conductive material. The second conductive layer 36 is in contact with a portion of the top surface of the second magnetoresistive element 22 near an end of the second magnetoresistive element 22 opposite to the boundary with the first magnetoresistive element 21, and also in contact with the bottom surface of the second yoke 12. The second conductive layer 36 thereby connects the second yoke 12 and the second magnetoresistive element 22. The second conductive layer 36 is shaped to be elongated in a direction parallel to the second virtual straight line Lx.

The conductive layer 34 is located forward of the first and second magnetoresistive elements 21 and 22 in the −Y direction, and is in contact with neither of the first and second magnetoresistive elements 21 and 22. The magnetic sensor 1 further includes a conductive layer 37 formed of a nonmagnetic conductive material. The conductive layer 37 is shaped to be elongated in a direction parallel to the third virtual straight line Ly. A portion of the conductive layer 37 near one end thereof in the longitudinal direction is in contact with portions of the top surfaces of the first and second magnetoresistive elements 21 and 22 near the boundary between the first and second magnetoresistive elements 21 and 22 in the layered structure 20. A portion of the conductive layer 37 near the other end thereof in the longitudinal direction is in contact with the bottom surface of the conductive layer 34. The conductive layer 37 thus connects the conductive layer 34 and the first and second magnetoresistive elements 21 and 22. The signal line 33 in the present embodiment is composed of the conductive layers 34 and 37.

The magnetic sensor 1 according to the present embodiment further includes conductive layers 38 and 39 each formed of a nonmagnetic conductive material. The conductive layer 38 is located forward of the first yoke 11 in the X direction, and connects the terminal 41 and the first conductive layer 35. The conductive layers 35 and 38 constitute the first portion 31 of the current path 30 of the present embodiment.

The conductive layer 39 is located forward of the second yoke 12 in the −X direction, and connects the terminal 42 and the second conductive layer 36. The conductive layers 36 and 39 constitute the second portion 32 of the current path 30 of the present embodiment.

The magnetic sensor 1 according to the present embodiment includes insulating layers 56 and 57 each formed of an insulating material, in place of the insulating layer 55 of the first embodiment. The first conductive layer 35 lies on the first magnetoresistive element 21 and the insulating layer 54. The second conductive layer 36 lies on the second magnetoresistive element 22 and the insulating layer 54. The conductive layer 37 lies on the first and second magnetoresistive elements 21 and 22 and the insulating layer 54. The insulating layer 56 lies on the layered structure 20 and the insulating layer 54, and surrounds the conductive layers 35, 36 and 37.

The first yoke 11 lies on the first conductive layer 35 and the insulating layer 56. The second yoke 12 lies on the second conductive layer 36 and the insulating layer 56. The conductive layer 34 lies on the conductive layer 37. The conductive layer 38 lies on the first conductive layer 35. The conductive layer 39 lies on the second conductive layer 36. The insulating layer 57 lies on the conductive layers 35, 36 and 37 and the insulating layer 56, and surrounds the first yoke 11, the second yoke 12 and the conductive layers 34, 38 and 39. The terminal 41 lies on the conductive layer 38 and the insulating layer 57. The terminal 42 lies on the conductive layer 39 and the insulating layer 57. The terminal 43 lies on the conductive layer 34 and the insulating layer 57.

Figure 21:
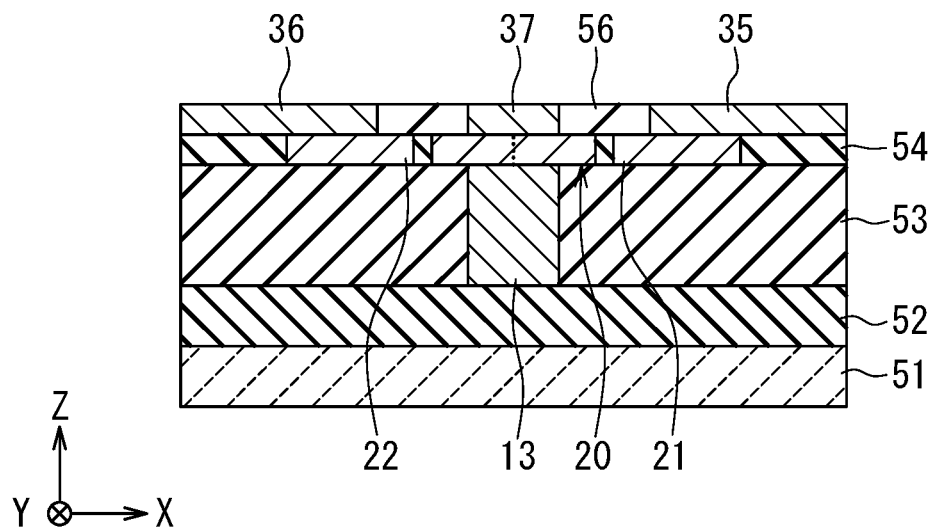
FIG. 21 is a cross-sectional view illustrating a step of a manufacturing method for the magnetic sensor according to the second embodiment of the invention.
Figure 22:
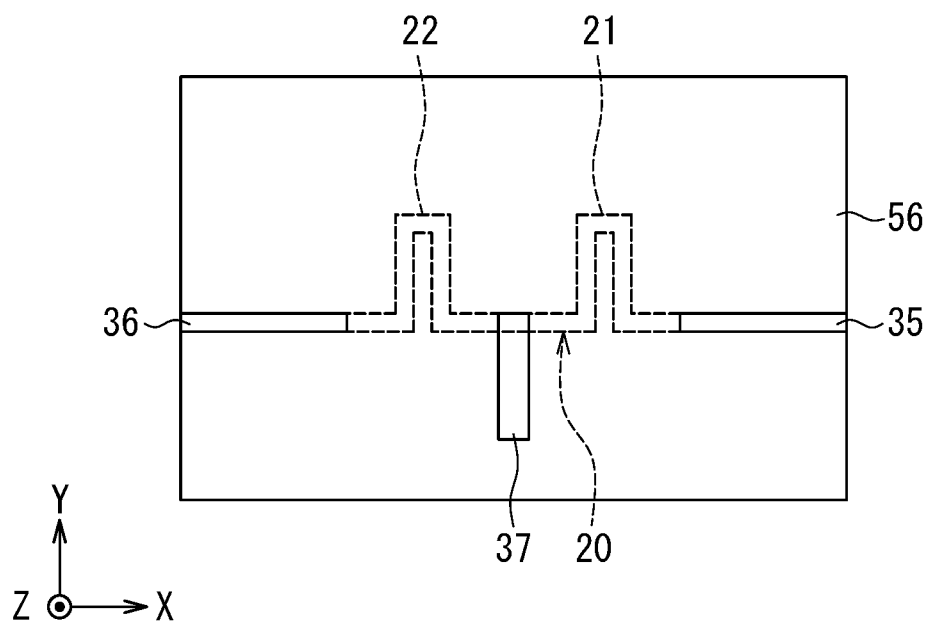
FIG. 22 is a plan view illustrating the step of FIG. 21.

Now, a manufacturing method for the magnetic sensor 1 according to the present embodiment will be described with reference to FIG. 21 and FIG. 22. FIG. 21 and FIG. 22 illustrate a step of the manufacturing method for the magnetic sensor 1 according to the present embodiment. The manufacturing method for the magnetic sensor 1 according to the present embodiment is the same as the first embodiment up to the step of forming the insulating layer 54. FIG. 21 and FIG. 22 illustrate the next step. In this step, the first conductive layer 35 is formed on the first magnetoresistive element 21 and the insulating layer 54, the second conductive layer 36 is formed on the second magnetoresistive element 22 and the insulating layer 54, and the conductive layer 37 is formed on the first and second magnetoresistive elements 21 and 22 and the insulating layer 54, by plating, for example. Next, the insulating layer 56 is formed to cover the conductive layers 35, 36 and 37. The insulating layer 56 is then polished by, for example, CMP, until the conductive layers 35, 36 and 37 are exposed.

Steps to follow the step of FIG. 21 and FIG. 22 will be described with reference to FIG. 19. First, the first yoke 11 is formed on the first conductive layer 35 and the insulating layer 56, the second yoke 12 is formed on the second conductive layer 36 and the insulating layer 56, the conductive layer 34 is formed on the conductive layer 37, the conductive layer 38 is formed on the first conductive layer 35, and the conductive layer 39 is formed on the second conductive layer 36, by plating, for example. Next, the insulating layer 57 is formed to cover the first yoke 11, the second yoke 12 and the conductive layers 34, 38 and 39. The insulating layer 57 is then polished by, for example, CMP, until the conductive layers 34, 38 and 39 are exposed. Next, the terminals 41, 42 and 43 are formed by plating, for example. The magnetic sensor 1 is thereby completed.

The present embodiment cannot provide the effect resulting from the first yoke 11 constituting the entirety of the first portion 31 of the current path 30 and the second yoke 12 constituting the entirety of the second portion 32 of the current path 30 described in relation to the first embodiment. The other configuration, operation and effects of the present embodiment are the same as those of the first embodiment.

Third Embodiment

Figure 23:
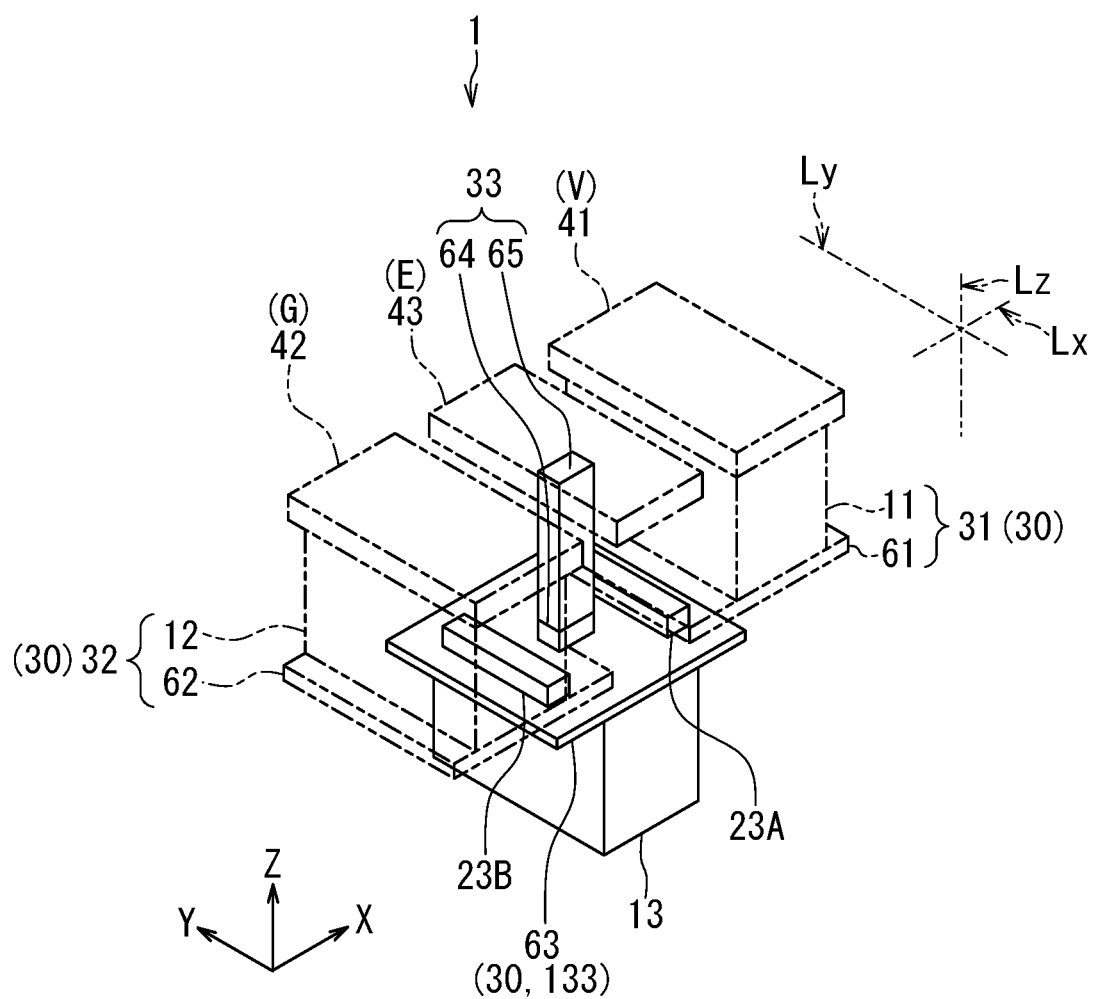
FIG. 23 is a perspective view of a magnetic sensor according to a third embodiment of the invention.
Figure 24:
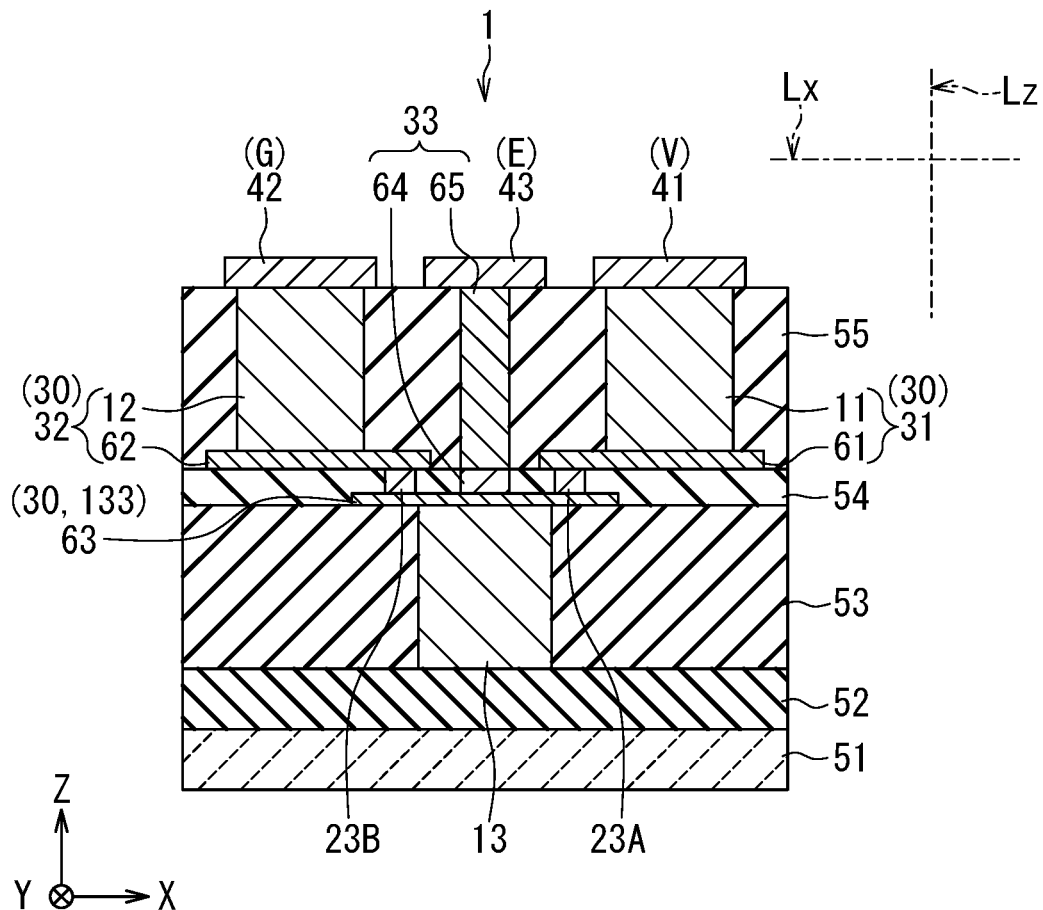
FIG. 24 is a cross-sectional view of the magnetic sensor according to the third embodiment of the invention.

A third embodiment of the present invention will now be described. First, reference is made to FIG. 23 and FIG. 24 to describe the configuration of a magnetic sensor according to the third embodiment of the invention. FIG. 23 is a perspective view of the magnetic sensor according to the third embodiment. FIG. 24 is a cross-sectional view of the magnetic sensor according to the third embodiment. The magnetic sensor 1 according to the third embodiment differs from the first embodiment in the following ways. The magnetic sensor 1 according to the third embodiment includes a first magnetoresistive element 23A and a second magnetoresistive element 23B, in place of the first magnetoresistive element 21 and the second magnetoresistive element 22 of the first embodiment.

The first magnetoresistive element 23A is disposed to intersect a YZ plane that passes between the first yoke 11 and the second yoke 13. The second magnetoresistive element 23B is disposed to intersect a YZ plane that passes between the second yoke 12 and the third yoke 13.

In the present embodiment, an XY plane that includes the top surface of the third yoke layer 13 is located below another XY plane that includes the bottom surfaces of the first and second yokes 11 and 12. The first and second magnetoresistive elements 23A and 23B are located within a spatial range extending from the XY plane that includes the top surface of the third yoke 13 to the other XY plane that includes the bottom surfaces of the first and second yokes 11 and 12.

The first magnetoresistive element 23A is configured to receive the first output magnetic field generated from the first yoke 11 and to generate the first resistance value, which is a detection value corresponding to the first output magnetic field component. The second magnetoresistive element 23B is configured to receive the second output magnetic field generated from the second yoke 12 and to generate the second resistance value, which is a detection value corresponding to the second output magnetic field component.

In the present embodiment, the first portion 31 of the current path 30 includes a first conductive layer 61 formed of a nonmagnetic conductive material. The first conductive layer 61 is in contact with the bottom surface of the first yoke 11 and the top surface of the first magnetoresistive element 23A, and connects the first yoke 11 and the first magnetoresistive element 23A. The first conductive layer 61 and the first yoke 11 constitute the first portion 31 in the present embodiment. In other words, the first yoke 11 constitutes part of the first portion 31. The first yoke 11 is electrically continuous with the first magnetoresistive element 23A.

The second portion 32 of the current path 30 includes a second conductive layer 62 formed of a nonmagnetic conductive material. The second conductive layer 62 is in contact with the bottom surface of the second yoke 12 and the top surface of the second magnetoresistive element 23B, and connects the second yoke 12 and the second magnetoresistive element 23B. The second conductive layer 62 and the second yoke 12 constitute the second portion 32 in the present embodiment. In other words, the second yoke 12 constitutes part of the second portion 32. The second yoke 12 is electrically continuous with the second magnetoresistive element 23B.

Further, in the present embodiment, the current path 30 includes a third portion 133 for connecting the first magnetoresistive element 23A and the second magnetoresistive element 23B. The third portion 133 includes a third conductive layer 63 formed of a nonmagnetic conductive material. The third conductive layer 63 is in contact with the bottom surface of the first magnetoresistive element 23A and the bottom surface of the second magnetoresistive element 23B, and connects the first magnetoresistive element 23A and the second magnetoresistive element 23B.

The magnetic sensor 1 according to the present embodiment includes conductive layers 64 and 65 each formed of a nonmagnetic conductive material, in place of the conductive layer 34 of the first embodiment. The conductive layers 64 and 65 are located between the first and second magnetoresistive elements 23A and 23B and stacked on the conductive layer 63. The conductive layer 65 is on the conductive layer 64. The signal line 33 in the present embodiment is composed of the conductive layers 64 and 65.

The third conductive layer 63 lies on the third yoke 13 and the insulating layer 53. In the present embodiment, the insulating layer 54 lies on the third yoke 13 and the insulating layer 53, and surrounds the first and second magnetoresistive elements 23A and 23B and the conductive layers 63 and 64. The first conductive layer 61 lies on the first magnetoresistive element 23A and the insulating layer 54. The second conductive layer 62 lies on the second magnetoresistive element 23B and the insulating layer 54. The first yoke 11 lies on the first conductive layer 61. The second yoke 12 lies on the second conductive layer 62. The conductive layer 65 lies on the conductive layer 64. The insulating layer 55 lies on the insulating layer 54 and surrounds the first and second yokes 11 and 12 and the conductive layers 61, 62 and 65. The terminal 43 lies on the conductive layer 65 and the insulating layer 55.

Figure 25:
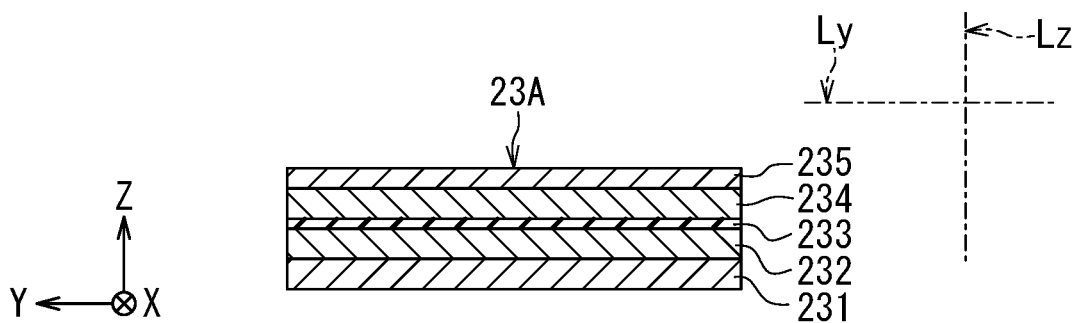
FIG. 25 is a cross-sectional view of the first magnetoresistive element of the third embodiment of the invention.

The first and second magnetoresistive elements 23A and 23B will now be described in detail. First, with reference to FIG. 25, the configuration of the first magnetoresistive element 23A will be described. FIG. 25 is a cross-sectional view of the first magnetoresistive element 23A. The first magnetoresistive element 23A includes a magnetization pinned layer 232 having a magnetization in a fixed direction, a free layer 234 having a magnetization in a variable direction, and a gap layer 233 located between the magnetization pinned layer 232 and the free layer 234.

In the example shown in FIG. 25, the first magnetoresistive element 23A further includes an antiferromagnetic layer 231 and a protective layer 235. The antiferromagnetic layer 231, the magnetization pinned layer 232, the gap layer 233, the free layer 234, and the protective layer 235 are stacked in this order in a direction parallel to the first virtual straight line Lz, the antiferromagnetic layer 231 being closest to the substrate 51 (see FIG. 24). The antiferromagnetic layer 231 is formed of an antiferromagnetic material and is in exchange coupling with the magnetization pinned layer 232 to fix the magnetization direction of the magnetization pinned layer 232. The protective layer 235 is to protect the free layer 234 located thereunder.

The second magnetoresistive element 23B has the same configuration as that of the first magnetoresistive element 23A. Thus, in the following description, components of the second magnetoresistive element 23B are denoted by the same reference signs as those used for the components of the first magnetoresistive element 23A.

In the present embodiment, the first and second magnetoresistive elements 23A and 23B are tunneling magnetoresistive (TMR) elements. In each of the first and second magnetoresistive elements 23A and 23B, a current passes through the magnetization pinned layer 232, the gap layer 233 and the free layer 234. In the present embodiment, the gap layer 233 is a tunnel barrier layer.

The first resistance value of the first magnetoresistive element 23A and the second resistance value of the second magnetoresistive element 23B vary depending on the the angle that the magnetization direction of the free layer 234 forms with the magnetization direction of the magnetization pinned layer 232. The first and second resistance values are minimized when the foregoing angle is 0°, and maximized when the foregoing angle is 180°.

The magnetization pinned layer 232 of the first magnetoresistive element 23A and that of the second magnetoresistive element 23B have the same magnetization direction. In the present embodiment, their magnetization direction is the −X direction.

As shown in FIG. 23, the first magnetoresistive element 23A is shaped to be elongated in a direction parallel to the third virtual straight line Ly. This causes the free layer 234 of the first magnetoresistive element 23A to have a shape anisotropy that establishes an easy axis direction parallel to the third virtual straight line Ly. Thus, when there is no first output magnetic field component, the magnetization direction of the free layer 234 is parallel to the third virtual straight line Ly. When the first output magnetic field component is present, the magnetization direction of the free layer 234 varies depending on the direction and strength of the first output magnetic field component. Thus, the angle that the magnetization direction of the free layer 234 forms with the magnetization direction of the magnetization pinned layer 232 varies depending on the direction and strength of the first output magnetic field component received by the first magnetoresistive element 23A. The first resistance value of the first magnetoresistive element 23A thus corresponds to the first output magnetic field component.

Likewise, the second magnetoresistive element 23B is shaped to be elongated in a direction parallel to the third virtual straight line Ly. This causes the free layer 234 of the second magnetoresistive element 23B to have a shape anisotropy that establishes an easy axis direction parallel to the third virtual straight line Ly. Thus, when there is no second output magnetic field component, the magnetization direction of the free layer 234 is parallel to the third virtual straight line Ly. When the second output magnetic field component is present, the magnetization direction of the free layer 234 varies depending on the direction and strength of the second output magnetic field component. Thus, the angle that the magnetization direction of the free layer 234 forms with the magnetization direction of the magnetization pinned layer 232 varies depending on the direction and strength of the second output magnetic field component received by the second magnetoresistive element 23B. The second resistance value of the second magnetoresistive element 23B thus corresponds to the second output magnetic field component.

The relationship between the directions of the input magnetic field component and the first and second output magnetic field components and the first and second resistance values of the first and second magnetoresistive elements 23A and 23B is the same as the relationship between the directions of the input magnetic field component and the first and second output magnetic field components and the first and second resistance values of the first and second magnetoresistive elements 21 and 22 described in relation to the first embodiment.

The first and second magnetoresistive elements 23A and 23B may be GMR elements of the current-perpendicular-to-plane (CPP) type in which a current is fed in a direction substantially perpendicular to the plane of the layers constituting the first and second magnetoresistive elements 23A and 24B. In such a case, the gap layers 233 are nonmagnetic conductive layers.

A manufacturing method for the magnetic sensor 1 according to the present embodiment will now be described with reference to FIG. 24. The manufacturing method for the magnetic sensor 1 according to the present embodiment is the same as the first embodiment up to the step of polishing the insulating layer 53. The next step of the present embodiment is to form the conductive layer 63 on the third yoke 13 and the insulating layer 53 by, for example, plating. Next, the first and second magnetoresistive elements 23A and 23B and the conductive layer 64 are formed on the conductive layer 63. The conductive layer 64 may be formed by plating, for example. Next, the insulating layer 54 is formed to cover the first and second magnetoresistive elements 23A and 23B and the conductive layer 64. The insulating layer 54 is then polished by, for example, CMP, until the first and second magnetoresistive elements 23A and 23B and the conductive layer 64 are exposed.

Next, the first conductive layer 61 is formed on the first magnetoresistive element 23A and the insulating layer 54, and the second conductive layer 62 is formed on the second magnetoresistive element 23B and the insulating layer 54, by plating, for example. Next, the first yoke 11 is formed on the first conductive layer 61, the second yoke 12 is formed on the second conductive layer 62, and the conductive layer 65 is formed on the conductive layer 64, by plating, for example. Next, the insulating layer 55 is formed to cover the first and second yokes 11 and 12 and the conductive layers 61, 62 and 65. The insulating layer 55 is then polished by, for example, CMP, until the first and second yokes 11 and 12 and the conductive layer 65 are exposed. Next, the terminals 41, 42 and 43 are formed by plating, for example. The magnetic sensor 1 is thereby completed.

The other configuration, operation and effects of the present embodiment are the same as those of the first embodiment.

Fourth Embodiment

Figure 26:
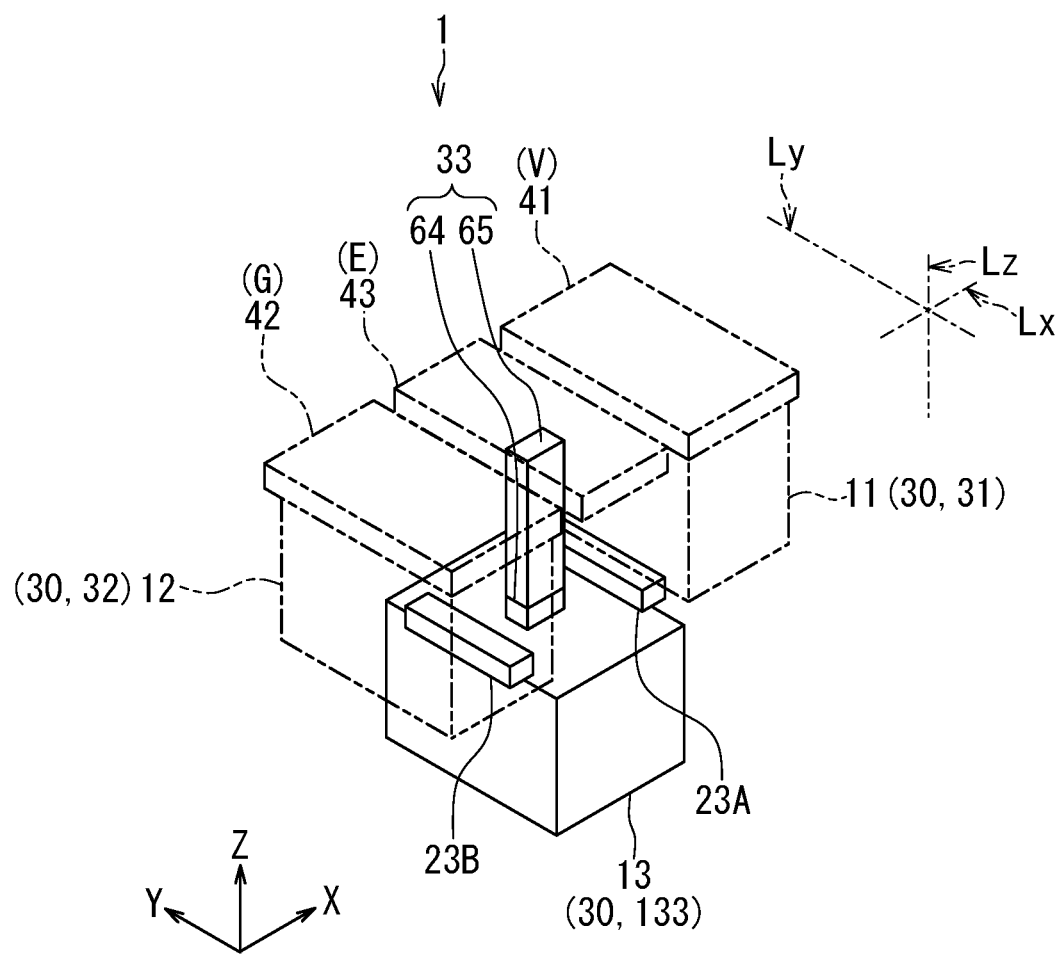
FIG. 26 is a perspective view of a magnetic sensor according to a fourth embodiment of the invention.
Figure 27:
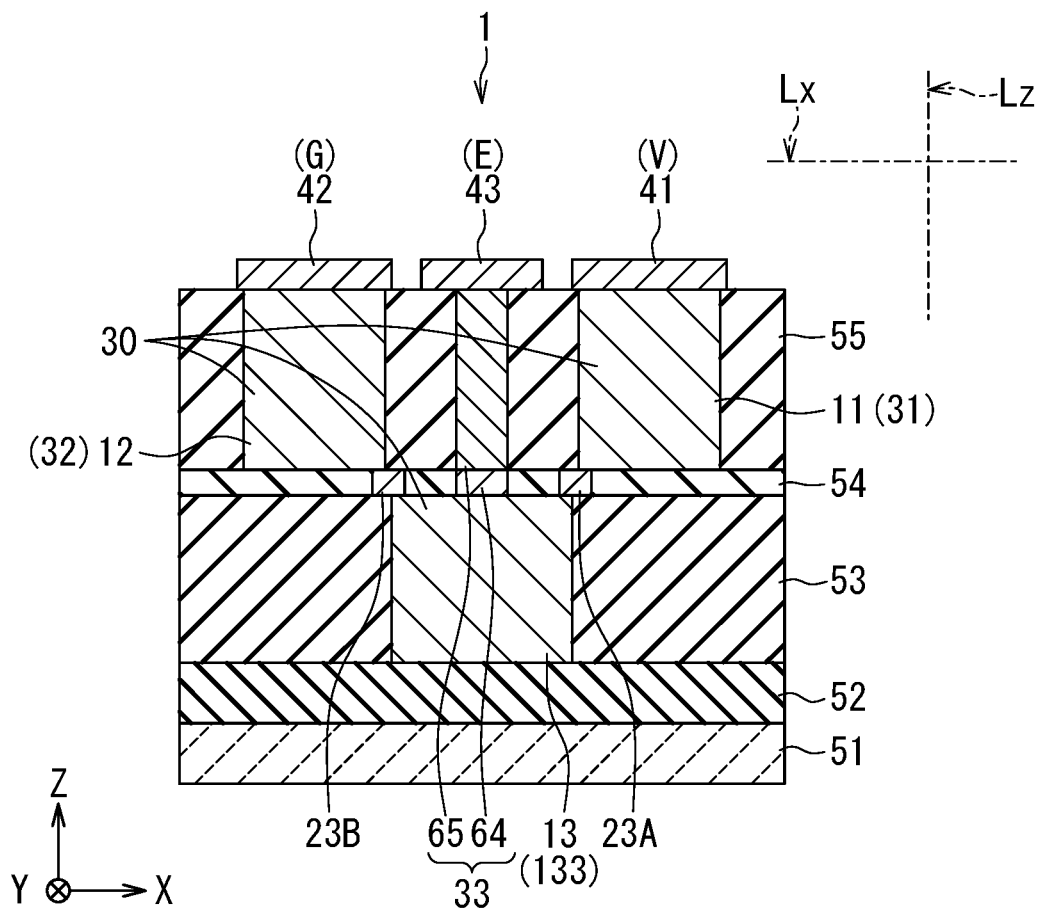
FIG. 27 is a cross-sectional view of the magnetic sensor according to the fourth embodiment of the invention.
Figure 28:
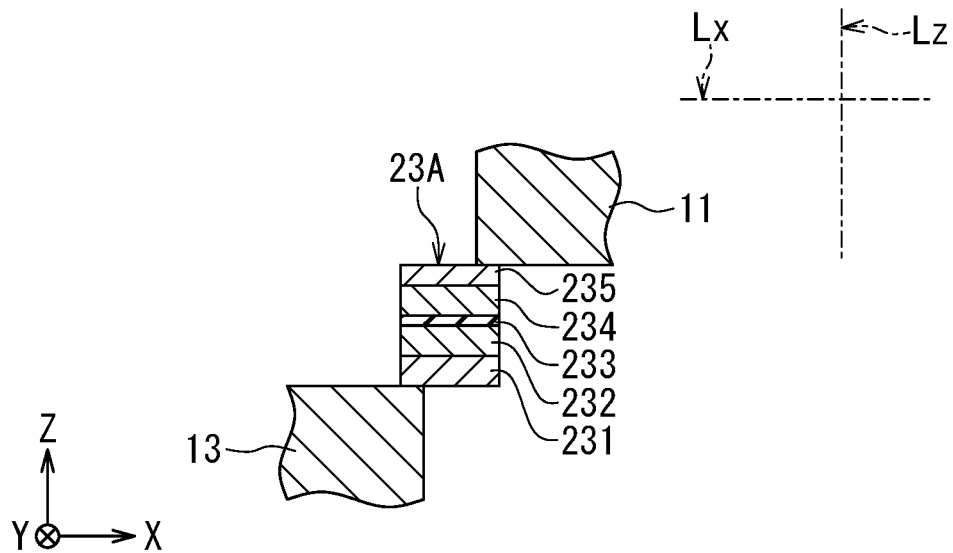
FIG. 28 is a cross-sectional view illustrating the first magnetoresistive element and portions in the vicinity thereof in the fourth embodiment of the invention.

A fourth embodiment of the present invention will now be described. First, reference is made to FIG. 26 to FIG. 28 to describe the configuration of a magnetic sensor according to the fourth embodiment of the invention. FIG. 26 is a perspective view of the magnetic sensor according to the fourth embodiment. FIG. 27 is a cross-sectional view of the magnetic sensor according to the fourth embodiment. FIG. 28 is a cross-sectional view illustrating the first magnetoresistive element and portions in the vicinity thereof in the fourth embodiment. The magnetic sensor 1 according to the fourth embodiment differs from the third embodiment in the following ways. In the fourth embodiment, the magnetic sensor 1 includes none of the first, second and third conductive layers 61, 62 and 63 of the third embodiment.

In the present embodiment, the first and second magnetoresistive elements 23A and 23B are disposed on the third yoke 13 and the insulating layer 53. As shown in FIG. 26 to FIG. 28, the third yoke 13 is in contact with a portion of the bottom surface of the first magnetoresistive element 23A or the bottom surface of the antiferromagnetic layer 231 near the end in the −X direction of the first magnetoresistive element 23A. The third yoke 13 is also in contact with a portion the bottom surface of the second magnetoresistive element 23B or the bottom surface of the antiferromagnetic layer 231 near the end in the X direction of the second magnetoresistive element 23B. The third yoke 13 connects the first magnetoresistive element 23A and the second magnetoresistive element 23B, and constitutes the third portion 133 of the current path 30 of the present embodiment.

The first yoke 11 lies on the first magnetoresistive element 23A and the insulating layer 54, and is in contact with the first magnetoresistive element 23A. As shown in FIG. 26 to FIG. 28, the first yoke 11 is in contact with a portion of the top surface of the first magnetoresistive element 23A or the top surface of the protective layer 235 near the end in the X direction of the first magnetoresistive element 23A. The first yoke 11 constitutes the entirety of the first portion 31 of the current path 30 of the present embodiment.

The second yoke 12 lies on the second magnetoresistive element 23B and the insulating layer 54, and is in contact with the second magnetoresistive element 23B. As shown in FIG. 26 and FIG. 27, the second yoke 12 is in contact with a portion of the top surface of the second magnetoresistive element 23B or the top surface of the protective layer 235 near the end in the −X direction of the second magnetoresistive element 23B. The second yoke 12 constitutes the entirety of the second portion 32 of the current path 30 of the present embodiment.

In the present embodiment, the conductive layer 64 is located between the first magnetoresistive element 23A and the second magnetoresistive element 23B, and lies on the third yoke 13. The signal line 33 in the present embodiment is composed of the conductive layers 64 and 65.

A manufacturing method for the magnetic sensor 1 according to the present embodiment will now be described briefly. The manufacturing method for the magnetic sensor 1 according to the present embodiment is the same as that for the magnetic sensor 1 according to the third embodiment except that the conductive layers 61, 62 and 63 are not formed. In the present embodiment, the first and second magnetoresistive elements 23A and 23B are formed on the third yoke 13 and the insulating layer 53. The conductive layer 64 is formed on the third yoke 13. The first yoke 11 is formed on the first magnetoresistive element 23A and the insulating layer 54. The second yoke 12 is formed on the second magnetoresistive element 23B and the insulating layer 54.

The other configuration, operation and effects of the present embodiment are the same as those of the third embodiment.

Fifth Embodiment

Figure 29:
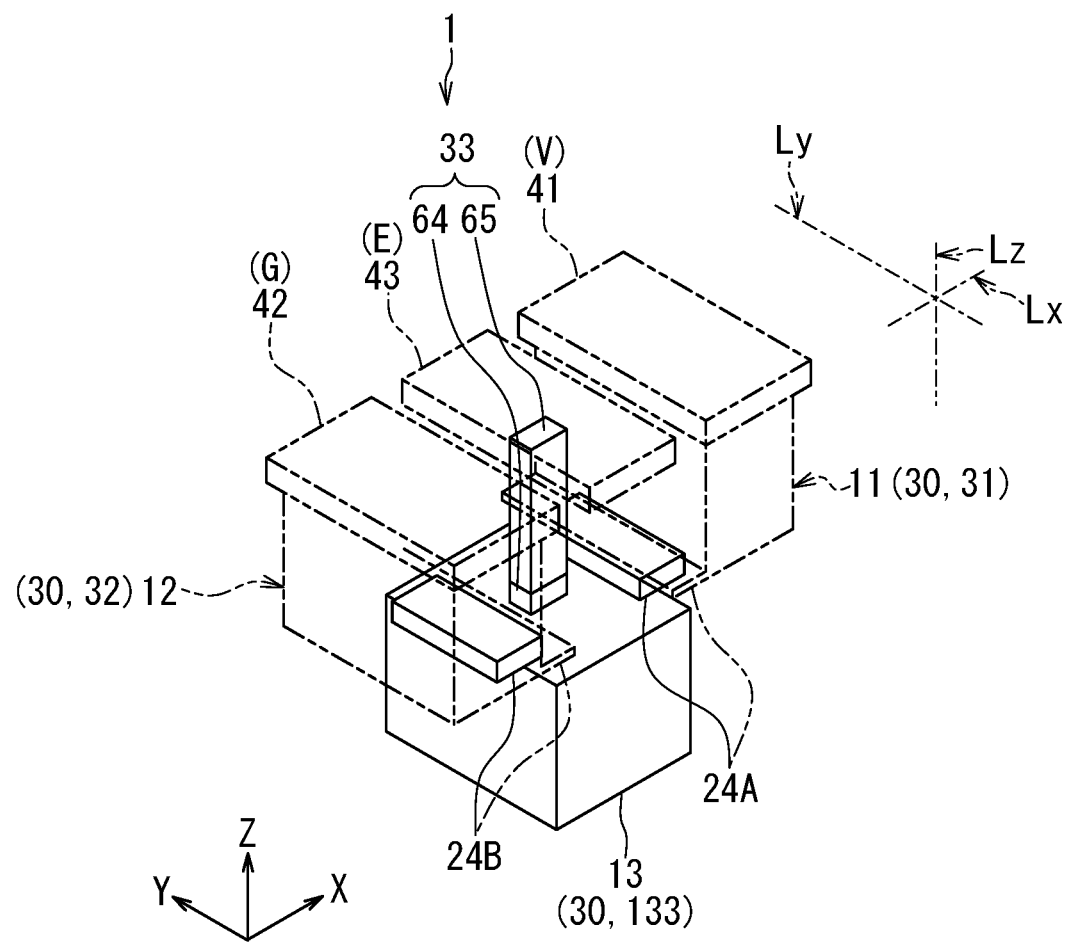
FIG. 29 is a perspective view of a magnetic sensor according to a fifth embodiment of the invention.
Figure 30:
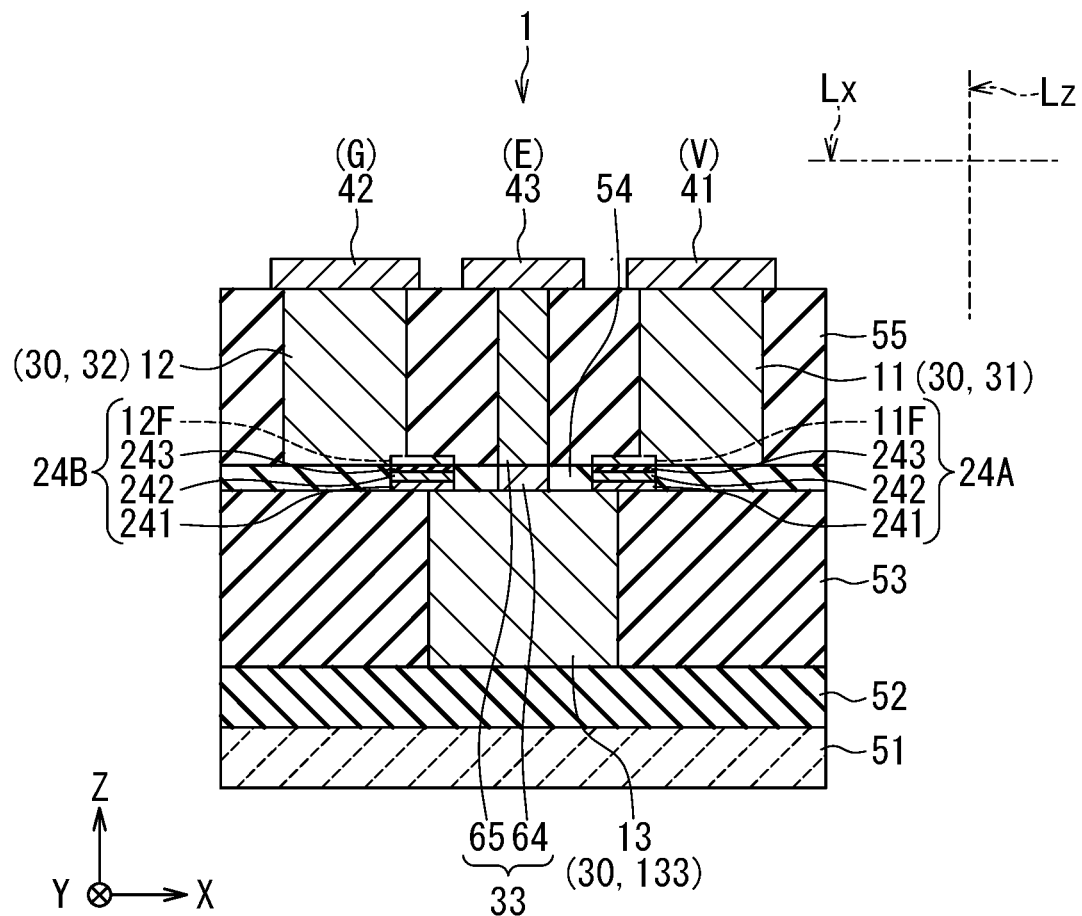
FIG. 30 is a cross-sectional view of the magnetic sensor according to the fifth embodiment of the invention.
Figure 31:
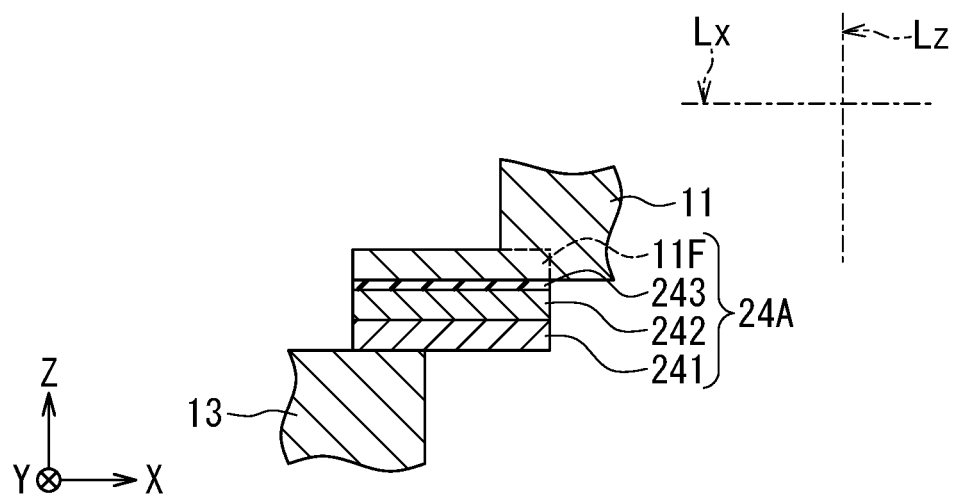
FIG. 31 is a cross-sectional view illustrating the first magnetoresistive element and portions in the vicinity thereof in the fifth embodiment of the invention.

A fifth embodiment of the present invention will now be described. First, reference is made to FIG. 29 to FIG. 31 to describe the configuration of a magnetic sensor according to the fifth embodiment of the invention. FIG. 29 is a perspective view of the magnetic sensor according to the fifth embodiment. FIG. 30 is a cross-sectional view of the magnetic sensor according to the fifth embodiment. FIG. 31 is a cross-sectional view illustrating a first magnetoresistive element and portions in the vicinity thereof in the fifth embodiment. The magnetic sensor 1 according to the fifth embodiment differs from the fourth embodiment in the following ways. The magnetic sensor 1 according to the fifth embodiment includes a first magnetoresistive element 24A and a second magnetoresistive element 24B, in place of the first magnetoresistive element 23A and the second magnetoresistive element 23B of the fourth embodiment.

As shown in FIG. 31, the first magnetoresistive element 24A includes a magnetization pinned layer 242 having a magnetization in a fixed direction, and a gap layer 243. In the example shown in FIG. 31, the first magnetoresistive element 24A further includes an antiferromagnetic layer 241. The antiferromagnetic layer 241, the magnetization pinned layer 242 and the gap layer 243 are stacked in this order in a direction parallel to the first virtual straight line Lz, the antiferromagnetic layer 241 being closest to the substrate 51 (see FIG. 30). The antiferromagnetic layer 241 and the magnetization pinned layer 242 are disposed to intersect an YZ plane that passes between the first yoke 11 and the third yoke 13. The gap layer 243 may be provided only on a portion of the top surface of the magnetization pinned layer 242 that lies below the first yoke 11. The antiferromagnetic layer 241 is formed of an antiferromagnetic material and is in exchange coupling with the magnetization pinned layer 242 to fix the magnetization direction of the magnetization pinned layer 242.

The second magnetoresistive element 24B has the same configuration as that of the first magnetoresistive element 24A. Thus, in the following description, components of the second magnetoresistive element 24B are denoted by the same reference signs as those used for the components of the first magnetoresistive element 24A. The antiferromagnetic layer 241 and the magnetization pinned layer 242 of the second magnetoresistive element 24B are disposed to intersect an YZ plane that passes between the second yoke 12 and the third yoke 13. The gap layer 243 of the second magnetoresistive element 24B may be provided only on a portion of the top surface of the magnetization pinned layer 242 that lies below the second yoke 12.

The antiferromagnetic layer 241 of the first magnetoresistive element 24A and the antiferromagnetic layer 241 of the second magnetoresistive element 24B are disposed on the third yoke 13 and the insulating layer 53. As shown in FIG. 29 to FIG. 31, the third yoke 13 is in contact with a portion of the antiferromagnetic layer 241 of the first magnetoresistive element 24A near the end in the −X direction of the antiferromagnetic layer 241 of the first magnetoresistive element 24A. The third yoke 13 is also in contact with a portion of the antiferromagnetic layer 241 of the second magnetoresistive element 24B near the end in the X direction of the antiferromagnetic layer 241 of the second magnetoresistive element 24B. The insulating layer 54 lies on the third yoke 13 and the insulating layer 53 and surrounds the antiferromagnetic layers 241, the magnetization pinned layers 242 and the gap layers 243 of the first and second magnetoresistive elements 24A and 24B.

In the present embodiment, the first yoke 11 lies on the gap layer 243 of the first magnetoresistive element 24A and the insulating layer 54, and is in contact with the gap layer 243. The first magnetoresistive element 24A further includes a free layer having a magnetization in a variable direction. A portion 11F of the first yoke 11 that has a surface in contact with the gap layer 243 also serves as the free layer of the first magnetoresistive element 24A. Hereinafter, this portion 11F will be referred to as the free-layer-corresponding portion 11F.

In the present embodiment, the second yoke 12 is in contact with the gap layer 243 of the second magnetoresistive element 24B. The second magnetoresistive element 24B further includes a free layer having a magnetization in a variable direction. A portion 12F of the second yoke 12 that has a surface in contact with the gap layer 243 also serves as the free layer of the second magnetoresistive element 24B. Hereinafter, this portion 12F will be referred to as the free-layer-corresponding portion 12F.

The first and second magnetoresistive elements 24A and 24B will now be described in more detail. The first magnetoresistive element 24A is configured to receive a first output magnetic field generated by the first yoke 11 and to generate a first resistance value, the first resistance value being a detection value corresponding to a first output magnetic field component. In the present embodiment, the first output magnetic field includes a magnetic field that occurs in the free-layer-corresponding portion 11F in response to the input magnetic field. The first output magnetic field component is a component of the magnetic field occurring in the free-layer-corresponding portion 11F, the component in a direction parallel to the second virtual straight line Lx.

Likewise, the second magnetoresistive element 24B is configured to receive a second output magnetic field generated by the second yoke 12 and to generate a second resistance value, the second resistance value being a detection value corresponding to a second output magnetic field component. In the present embodiment, the second output magnetic field includes a magnetic field that occurs in the free-layer-corresponding portion 12F in response to the input magnetic field. The second output magnetic field component is a component of the magnetic field occurring in the free-layer-corresponding portion 12F, the component in a direction parallel to the second virtual straight line Lx.

In the present embodiment, the first and second magnetoresistive elements 24A and 24B are tunneling magnetoresistive (TMR) elements. In the first magnetoresistive element 24A, a current passes through the magnetization pinned layer 242, the gap layer 243 and the free-layer-corresponding portion 11F. In the second magnetoresistive element 24B, a current passes through the magnetization pinned layer 242, the gap layer 243 and the free-layer-corresponding portion 12F. In the present embodiment, the gap layers 243 are tunnel barrier layers.

The first resistance value of the first magnetoresistive element 24A varies depending on the angle that the magnetization direction of the free-layer-corresponding portion 11F forms with the magnetization direction of the magnetization pinned layer 242, and is minimized when the foregoing angle is 0°, and maximized when the foregoing angle is 180°.

The second resistance value of the second magnetoresistive element 24B varies depending on the angle that the magnetization direction of the free-layer-corresponding portion 12F forms with the magnetization direction of the magnetization pinned layer 242, and is minimized when the foregoing angle is 0°, and maximized when the foregoing angle is 180°.

The magnetization pinned layer 242 of the first magnetoresistive element 24A and that of the second magnetoresistive element 24B have the same magnetization direction. In the present embodiment, their magnetization direction is the −X direction.

As shown in FIG. 29, the first yoke 11 is shaped to be elongated in a direction parallel to the third virtual straight line Ly. This causes the first yoke 11 including the free-layer-corresponding portion 11F to have a shape anisotropy that establishes an easy axis direction parallel to the third virtual straight line Ly. Thus, when there is no first output magnetic field component, the magnetization direction of the free-layer-corresponding portion 11F is parallel to the third virtual straight line Ly. When the first output magnetic field component is present, the magnetization direction of the free-layer-corresponding portion 11F varies depending on the direction and strength of the first output magnetic field component. Thus, the angle that the magnetization direction of the free-layer-corresponding portion 11F forms with the magnetization direction of the magnetization pinned layer 242 varies depending on the direction and strength of the first output magnetic field component received by the first magnetoresistive element 24A. The first resistance value of the first magnetoresistive element 24A thus corresponds to the first output magnetic field component.

Likewise, the second yoke 12 is shaped to be elongated in a direction parallel to the third virtual straight line Ly. This causes the second yoke 12 including the free-layer-corresponding portion 12F to have a shape anisotropy that establishes an easy axis direction parallel to the third virtual straight line Ly. Thus, when there is no second output magnetic field component, the magnetization direction of the free-layer-corresponding portion 12F is parallel to the third virtual straight line Ly. When the second output magnetic field component is present, the magnetization direction of the free-layer-corresponding portion 12F varies depending on the direction and strength of the second output magnetic field component. Thus, the angle that the magnetization direction of the free-layer-corresponding portion 12F forms with the magnetization direction of the magnetization pinned layer 242 varies depending on the direction and strength of the second output magnetic field component received by the second magnetoresistive element 24B. The second resistance value of the second magnetoresistive element 24B thus corresponds to the second output magnetic field component.

The relationship between the directions of the input magnetic field component and the first and second output magnetic field components and the first and second resistance values of the first and second magnetoresistive elements 24A and 24B is the same as the relationship between the directions of the input magnetic field component and the first and second output magnetic field components and the first and second resistance values of the first and second magnetoresistive elements 23A and 23B described in relation to the fourth embodiment.

The first and second magnetoresistive elements 24A and 24B may be GMR elements of the CPP type in which a current is fed in a direction substantially perpendicular to the plane of the layers constituting the first and second magnetoresistive elements 24A and 24B. In such a case, the gap layers 243 are nonmagnetic conductive layers.

A manufacturing method for the magnetic sensor 1 according to the present embodiment will now be described briefly. The manufacturing method for the magnetic sensor 1 according to the present embodiment is the same as the manufacturing method for the magnetic sensor 1 according to the fourth embodiment, except that the antiferromagnetic layers 241, the magnetization pinned layers 242 and the gap layers 243 of the first and second magnetoresistive elements 24A and 24B are formed instead of the first and second magnetoresistive elements 23A and 23B. The first yoke 11 is formed on the gap layer 243 of the first magnetoresistive element 24A and the insulating layer 54. The second yoke 12 is formed on the gap layer 243 of the second magnetoresistive element 24B and the insulating layer 54.

The other configuration, operation and effects of the present embodiment are the same as those of the fourth embodiment.

Sixth Embodiment

Figure 32:
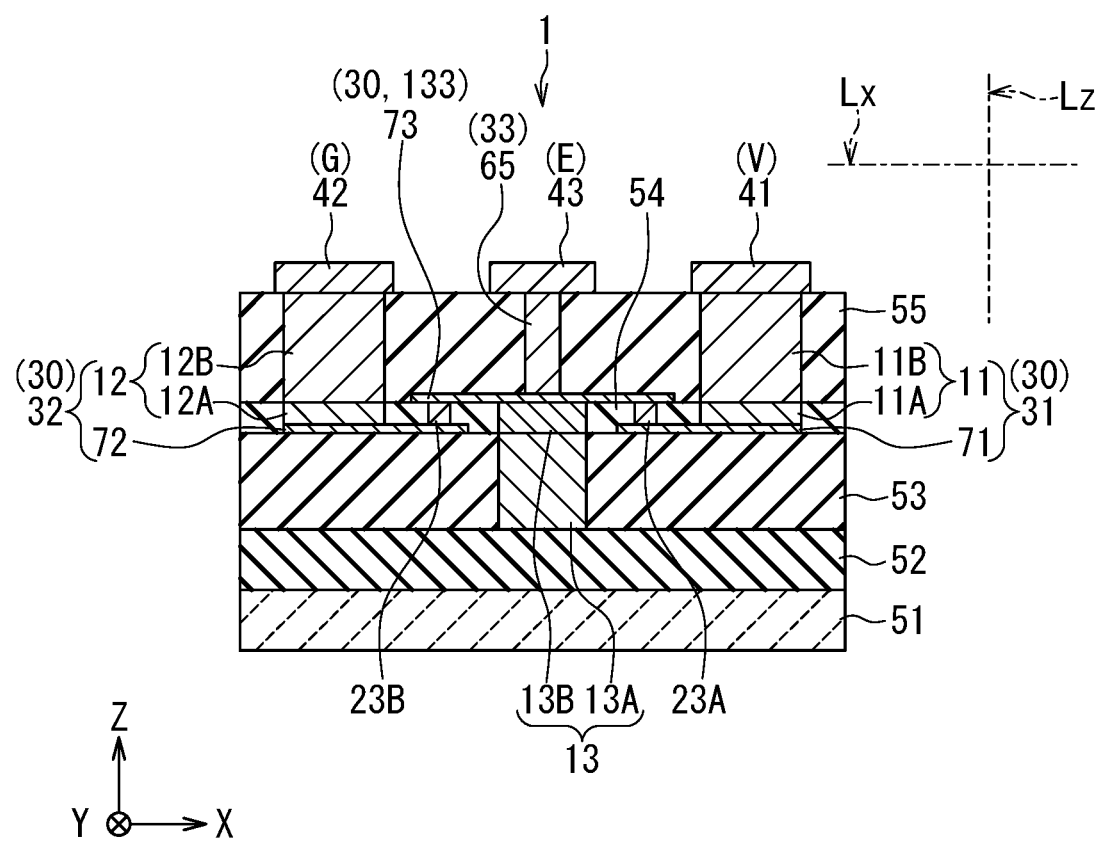
FIG. 32 is a cross-sectional view of a magnetic sensor according to a sixth embodiment of the invention.

A sixth embodiment of the present invention will now be described. First, reference is made to FIG. 32 to describe the configuration of a magnetic sensor according to the sixth embodiment of the invention. FIG. 32 is a cross-sectional view of the magnetic sensor according to the sixth embodiment. The magnetic sensor 1 according to the sixth embodiment differs from the third embodiment in the following ways. In the present embodiment, the first portion 31 of the current path 30 includes a first conductive layer 71 instead of the first conductive layer 61 of the third embodiment. Further, the second portion 32 of the current path 30 includes a second conductive layer 72 instead of the second conductive layer 62 of the third embodiment, The first and second conductive layers 71 and 72 are disposed on the insulating layer 53.

The first conductive layer 71 is in contact with the bottom surface of the first yoke 11 and the bottom surface of the first magnetoresistive element 23A, and connects the first yoke 11 and the first magnetoresistive element 23A. The first conductive layer 71 and the first yoke 11 constitute the first portion 31 in the present embodiment. The first yoke 11 in the present embodiment includes a first layer 11A and a second layer 11B stacked on the first conductive layer 71.

The second conductive layer 72 is in contact with the bottom surface of the second yoke 12 and the bottom surface of the second magnetoresistive element 23B, and connects the second yoke 12 and the second magnetoresistive element 23B. The second conductive layer 72 and the second yoke 12 constitute the second portion 32 in the present embodiment. The second yoke 12 in the present embodiment includes a first layer 12A and a second layer 12B stacked on the second conductive layer 72.

In the present embodiment, the third yoke 13 includes a first layer 13A and a second layer 13B stacked on the insulating layer 52. The insulating layer 54 lies on the insulating layer 53 and surrounds the first layer 11A of the first yoke 11, the first layer 12A of the second yoke 12, the first and second magnetoresistive elements 23A and 23B, the second layer 13B of the third yoke 13, and the first and second conductive layers 71 and 72.

In the present embodiment, the third portion 133 of the current path 30 includes a third conductive layer 73 formed of a nonmagnetic conductive material, instead of the third conductive layer 63 of the third embodiment. The third conductive layer 73 lies on the second layer 13B of the third yoke 13, the first magnetoresistive element 23A, the second magnetoresistive element 23B and the insulating layer 54. The third conductive layer 73 is thus in contact with the top surfaces of the first and second magnetoresistive elements 23A and 23B, and connects the first and second magnetoresistive elements 23A and 23B.

The conductive layer 65 lies on the third conductive layer 73. The signal line 33 in the present embodiment is formed of the conductive layer 65. The insulating layer 55 lies on the insulating layer 54 and surrounds the second layer 11B of the first yoke 11, the second layer 12B of the second yoke 12 and the conductive layers 65 and 73. The conductive layer 64 of the third embodiment is not provided in the present embodiment.

A manufacturing method for the magnetic sensor 1 according to the present embodiment will now be described with reference to FIG. 32. The manufacturing method for the magnetic sensor 1 according to the present embodiment is the same as the first embodiment up to the step of forming the insulating layer 52. The next step of the present embodiment is to form the first layer 13A of the third yoke 13 on the insulating layer 52 by, for example, plating. Next, the insulating layer 53 is formed to cover the first layer 13A. The insulating layer 53 is then polished by, for example, CMP, until the first layer 13A is exposed.

Next, the first conductive layer 71 and the second conductive layer 72 are formed on the insulating layer 53 by, for example, plating. Then, the first magnetoresistive element 23A and the first layer 11A of the first yoke 11 are formed on the first conductive layer 71, the second magnetoresistive element 23B and the first layer 12A of the second yoke 12 are formed on the second conductive layer 72, and the second layer 13B of the third yoke 13 is formed on the first layer 13A of the third yoke 13. The first layers 11A and 12A and the second layer 13B are formed by plating, for example.

Next, the insulating layer 54 is formed to cover the first and second magnetoresistive elements 23A and 23B, the first layers 11A and 12A, and the second layer 13B. The insulating layer 54 is then polished by, for example, CMP, until the first and second magnetoresistive elements 23A and 23B, the first layers 11A and 12A, and the second layer 13B are exposed. Next, the conductive layer 73 is formed on the first and second magnetoresistive elements 23A and 23B, the second layer 13B and the insulating layer 54 by, for example, plating. Then, the second layer 11B of the first yoke 11 is formed on the first layer 11A, the second layer 12B of the second yoke 12 is formed on the first layer 12A, and the conductive layer 65 is formed on the conductive layer 73, by plating, for example. The subsequent steps are the same as those in the third embodiment.

In the present embodiment, the first and second magnetoresistive elements 23A and 23B are located in an XY plane that includes the bottom surfaces of the first and second yokes 11 and 12. In the configuration shown in FIG. 32, the top surface of the third yoke 13 is located above the aforementioned XY plane and is in contact with the bottom surface of the third conductive layer 73. The third yoke 13 need not necessarily include the second layer 13B. The top surface of the third yoke 13 need not necessarily be in contact with the bottom surface of the third conductive layer 73. In such a case, the top surface of the third yoke 13 may be located above or below the aforementioned XY plane, or in the aforementioned XY plane. The level of the top surface of the third yoke 13 in the Z direction may be adjusted so as to enhance the first output magnetic field component to be applied to the magnetoresistive element 23A and the second output magnetic field component to be applied to the magnetoresistive element 23B.

The other configuration, operation and effects of the present embodiment are the same as those of the third embodiment.

Seventh Embodiment

Figure 33:
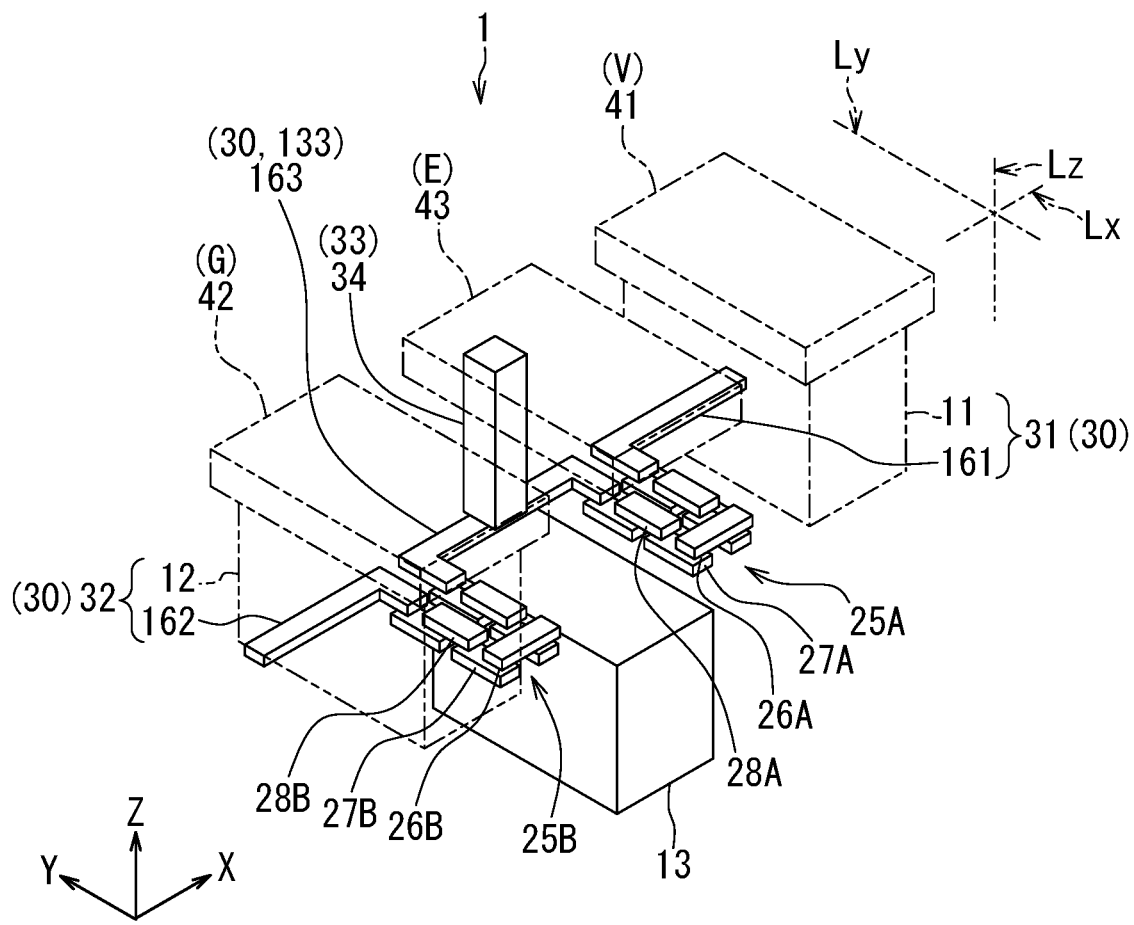
FIG. 33 is a perspective view of a magnetic sensor according to a seventh embodiment of the invention.
Figure 34:
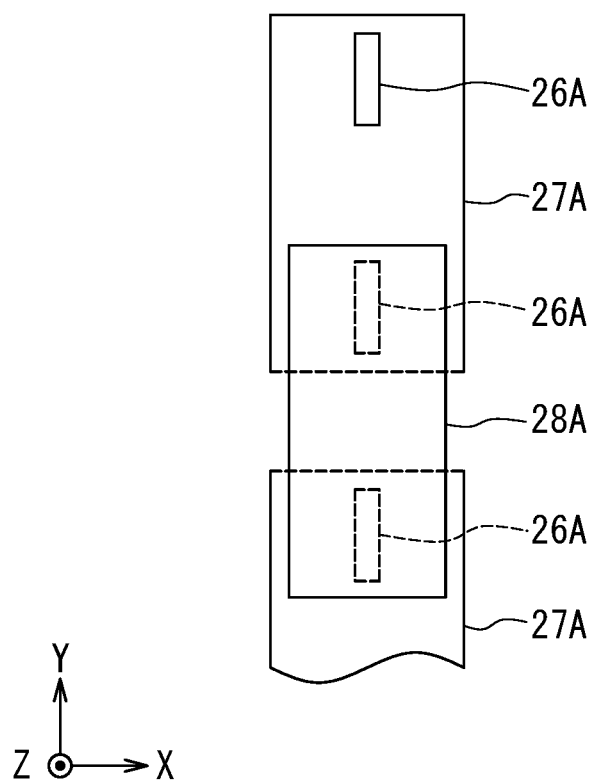
FIG. 34 is a plan view illustrating part of a first element train of the seventh embodiment of the invention.

A seventh embodiment of the present invention will now be described. FIG. 33 is a perspective view of a magnetic sensor according to the seventh embodiment. FIG. 34 is a plan view illustrating part of a first element train and the vicinity thereof in the seventh embodiment.

The magnetic sensor 1 according to the seventh embodiment differs from the third embodiment in the following ways. In the seventh embodiment, a first element train 25A is provided in place of one first magnetoresistive element 23A of the third embodiment, and a second element train 25B is provided in place of one second magnetoresistive element 23B of the third embodiment. The first element train 25A is provided between the power supply port V and the output port E. The second element train 25B is provided between the ground port G and the output port E.

In the present embodiment, a first conductive layer 161, a second conductive layer 162 and a third conductive layer 163, each of which is formed of a nonmagnetic conductive material, are provided in place of the first conductive layer 61, the second conductive layer 62 and the third conductive layer 63 of the third embodiment.

The top surface of the first conductive layer 161 is in contact with the bottom surface of the first yoke 11. The top surface of the second conductive layer 162 is in contact with the bottom surface of the second yoke 12. The top surface of the third conductive layer 163 is in contact with the bottom surface of the conductive layer 34.

The first element train 25A includes a plurality of magnetoresistive elements 26A, and one or more first connection layers for connecting the plurality of magnetoresistive elements 26A in series. Each of the one or more first connection layers connects two magnetoresistive elements 26A that are adjacent to each other in circuit configuration. Likewise, the second element train 25B includes a plurality of magnetoresistive elements 26B, and one or more second connection layers for connecting the plurality of magnetoresistive elements 26B in series. Each of the one or more second connection layers connects two magnetoresistive elements 26B that are adjacent to each other in circuit configuration. The one or more first connection layers and the one or more second connection layers are each formed of a nonmagnetic conductive material.

The plurality of magnetoresistive elements 26A correspond to the at least one first magnetoresistive element in the present invention. The plurality of magnetoresistive elements 26B correspond to the at least one second magnetoresistive element in the present invention.

Each of the magnetoresistive elements 26A and 26B has the same configuration as that of the magnetoresistive element 23A shown in FIG. 25, and is shaped to be elongated in a direction parallel to the third virtual straight line Ly.

Each of the magnetoresistive elements 26A is configured to receive the first output magnetic field generated from the first yoke 11 and to generate the first resistance value, which is a detection value corresponding to the first output magnetic field component. Each of the magnetoresistive elements 26B is configured to receive the second output magnetic field generated from the second yoke 12 and to generate the second resistance value, which is a detection value corresponding to the second output magnetic field component.

FIG. 33 illustrates an example in which the first element train 25A includes eight magnetoresistive elements 26A, and the second element train 25B includes eight magnetoresistive elements 26B. In this example, the first element train 25A includes four lower connection layers 27A and three upper connection layers 28A, as the one or more first connection layers. The second element train 25B includes four lower connection layers 27B and three upper connection layers 28B, as the one or more second connection layers.

The eight magnetoresistive elements 26A will be referred to as the first to eighth magnetoresistive elements 26A in the order of proximity to the power supply port V in circuit configuration. The first, second, third and fourth magnetoresistive elements 26A are arranged in this order in a row in the −Y direction. The fifth, sixth, seventh and eighth magnetoresistive elements 26A are arranged in this order in a row in the Y direction. The row of the fifth to eighth magnetoresistive elements 26A is located forward of the row of the first to fourth magnetoresistive elements 26A in the −X direction.

The eight magnetoresistive elements 26B will be referred to as the first to eighth magnetoresistive elements 26B in the order of proximity to the ground port G in circuit configuration. The first, second, third and fourth magnetoresistive elements 26B are arranged in this order in a row in the −Y direction. The fifth, sixth, seventh and eighth magnetoresistive elements 26B are arranged in this order in a row in the Y direction. The row of the fifth to eighth magnetoresistive elements 26B is located forward of the row of the first to fourth magnetoresistive elements 26B in the X direction.

FIG. 34 is a plan view illustrating part of the first element train 25A. As shown in FIG. 34, each single lower connection layer 27A is in contact with the bottom surfaces of two magnetoresistive elements 26A that are adjacent to each other in circuit configuration, and electrically connects those two magnetoresistive elements 26A. Each single upper connection layer 28A is in contact with the top surfaces of two magnetoresistive elements 26A that are adjacent to each other in circuit configuration and are in contact with different ones of the lower connection layers 27A, and electrically connects those two magnetoresistive elements 26A. The second element train 25B has the same configuration as that of the first element train 25A.

The top surface of the first magnetoresistive element 26A is in contact with the bottom surface of the first conductive layer 161, and the bottom surface of the first magnetoresistive element 26A is in contact with the top surface of one of the lower connection layers 27A. The top surface of the eighth magnetoresistive element 26A is in contact with the bottom surface of the third conductive layer 163, and the bottom surface of the eighth magnetoresistive element 26A is in contact with the top surface of another one of the lower connection layers 27A.

The top surface of the first magnetoresistive element 26B is in contact with the bottom surface of the second conductive layer 162, and the bottom surface of the first magnetoresistive element 26B is in contact with the top surface of one of the lower connection layers 27B. The top surface of the eighth magnetoresistive element 26B is in contact with the bottom surface of the third conductive layer 163, and the bottom surface of the eighth magnetoresistive element 26B is in contact with the top surface of another one of the lower connection layers 27B.

In the present embodiment, an XY plane that includes the top surface of the third yoke 13 is located below another XY plane that includes the bottom surfaces of the first and second yokes 11 and 12. The magnetoresistive elements 26A and 26B are located within a spatial range extending from the XY plane that includes the top surface of the third yoke 13 to the other XY plane that includes the bottom surfaces of the first and second yokes 11 and 12.

The first yoke 11 and the first conductive layer 161 constitute the first portion 31 of the current path 30. The second yoke 12 and the second conductive layer 162 constitute the second portion 32 of the current path 30. The third conductive layer 163 constitutes the third portion 133 of the current path 30. The third portion 133 connects the first element train 25A and the second element train 25B.

The current path 30 of the present embodiment includes the one or more first connection layers included in the first element train 25A and the one or more second connection layers included in the second element train 25B.

The other configuration, operation and effects of the present embodiment are the same as those of the third embodiment.

Eighth Embodiment

Figure 35:
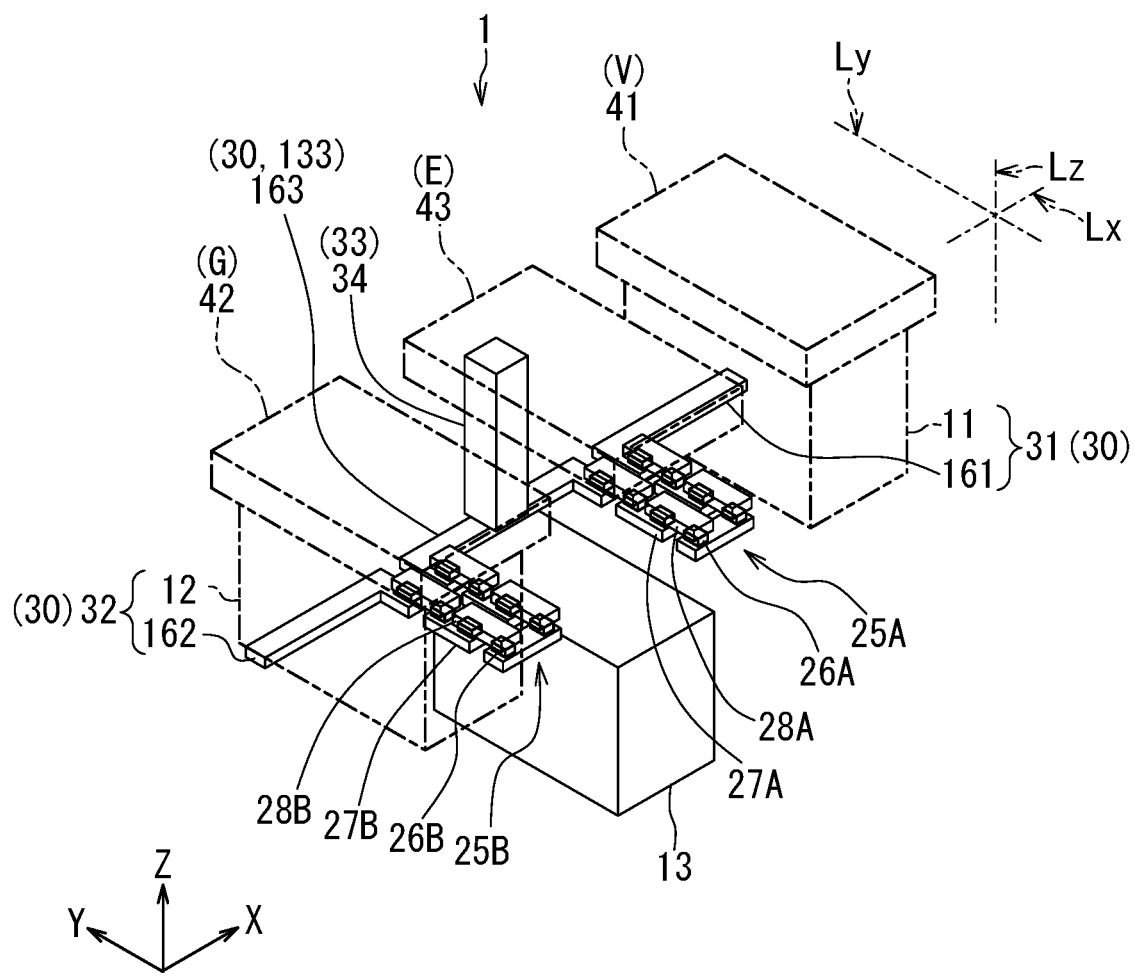
FIG. 35 is a perspective view of a magnetic sensor according to an eighth embodiment of the invention.

An eighth embodiment of the present invention will now be described. FIG. 35 is a perspective view of a magnetic sensor according to the eighth embodiment.

The magnetic sensor 1 according to the eighth embodiment differs from the seventh embodiment in the following ways. In the eighth embodiment, the first element train 25A includes three lower connection layers 27A and four upper connection layers 28A, as the one or more first connection layers. The second element train 25B includes three lower connection layers 27B and four upper connection layers 28B, as the one or more second connection layers.

In the present embodiment, the bottom surface of the first magnetoresistive element 26A is in contact with the top surface of the first conductive layer 161, and the top surface of the first magnetoresistive element 26A is in contact with the bottom surface of one of the upper connection layers 28A. The bottom surface of the eighth magnetoresistive element 26A is in contact with the top surface of the third conductive layer 163, and the top surface of the eighth magnetoresistive element 26A is in contact with the bottom surface of another one of the upper connection layers 28A.

The bottom surface of the first magnetoresistive element 26B is in contact with the top surface of the second conductive layer 162, and the top surface of the first magnetoresistive element 26B is in contact with the bottom surface of one of the upper connection layers 28B. The bottom surface of the eighth magnetoresistive element 26B is in contact with the top surface of the third conductive layer 163, and the top surface of the eighth magnetoresistive element 26B is in contact with the bottom surface of another one of the upper connection layers 28B.

In the present embodiment, the magnetoresistive elements 26A and 26B are located in an XY plane that includes the bottom surfaces of the first and second yokes 11 and 12. The top surface of the third yoke 13 may or may not be in contact with the bottom surface of the third conductive layer 163. The level of the top surface of the third yoke 13 in the Z direction may be adjusted so as to enhance the first output magnetic field components to be applied to the magnetoresistive elements 26A and the second output magnetic field components to be applied to the magnetoresistive elements 26B.

The other configuration, operation and effects of the present embodiment are the same as those of the seventh embodiment.

The present invention is not limited to the foregoing embodiments, and various modifications may be made thereto. For example, as far as the requirements of the appended claims are met, the numbers, shapes and locations of the at least one yoke and the at least one magnetoresistive element are not limited to the respective examples illustrated in the foregoing embodiments, but can be freely chosen. For example, the magnetic sensor 1 may be provided with a single magnetoresistive element or three or more magnetoresistive elements, as the at least one magnetoresistive element.

Further, the magnetoresistive elements may be configured without any antiferromagnetic layer. In such a case, a magnetization pinned layer of an artificial antiferromagnetic structure, which includes two ferromagnetic layers and a nonmagnetic metal layer interposed between the two ferromagnetic layers, may be provided in place of the antiferromagnetic layer and the magnetization pinned layer.

The first to fourth detection portions 21A, 21B, 22A and 22B of the first and second embodiments, and the magnetoresistive elements of the third, fourth, and sixth to eighth embodiments may each have, from a plan view, a circular or other shape that does not provide a shape anisotropy. In such a case, a bias magnetic field in a direction parallel to the third virtual straight line Ly may be applied to each of the detection portions 21A, 21B, 22A and 22B or to each of the magnetoresistive elements. To be more specific, a plurality of magnets may be provided to apply the bias magnetic field. Alternatively, the first and second yokes 11 and 12 may be magnetized in a direction parallel to the third virtual straight line Ly, or an antiferromagnetic layer may be provided between the free layer and the protective layer.

The free layers 204 of the first to fourth detection portions 21A, 21B, 22A and 22B of the first and second embodiments and the free layers 234 of the magnetoresistive elements of the third, fourth, and sixth to eighth embodiments may each be formed of a perpendicular magnetization film whose easy axis direction is parallel to the first virtual straight line Lz.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising: at least one yoke formed of a soft magnetic material; an additional yoke formed of the soft magnetic material; at least one magnetic detection element; and a current path for passing a current through the at least one magnetic detection element, wherein the at least one yoke is configured to receive an input magnetic field and to generate an output magnetic field, the input magnetic field containing an input magnetic field component in a direction parallel to a first virtual straight line, the output magnetic field contains an output magnetic field component in a direction parallel to a second virtual straight line intersecting the first virtual straight line, the output magnetic field component varying depending on the input magnetic field component, the output magnetic field component develops between the at least one yoke and the additional yoke, the at least one magnetic detection element is configured to be energized by the current path, to receive the output magnetic field and to generate a detection value corresponding to the output magnetic field component, the at least one yoke is electrically continuous with the at least one magnetic detection element, the magnetic sensor further comprises at least one conductive layer formed of a nonmagnetic conductive material and connecting the at least one yoke and the at least one magnetic detection element, and an additional conductive layer formed of a nonmagnetic conductive material, each of the at least one yoke and the at least one magnetic detection element has a first surface lying at an end in a third direction which is a direction parallel to the first virtual straight line, each of the additional yoke and the at least one magnetic detection element has a second surface lying at an end in a fourth direction opposite to the third direction, each of the at least one conductive layer is in direct contact with the first surface of the at least one yoke and the first surface of the at least one magnetic detection element, and the additional conductive layer is in direct contact with the second surface of the additional yoke and the second surface of the at least one magnetic direction element.

2. The magnetic sensor according to claim 1, wherein the second virtual straight line is orthogonal to the first virtual straight line.

3. The magnetic sensor according to claim 1, wherein the at least one yoke constitutes at least part of the current path.

4. The magnetic sensor according to claim 1, wherein the at least one magnetic detection element is at least one magnetoresistive element.

5. The magnetic sensor according to claim 4, wherein the at least one magnetoresistive element includes a magnetization pinned layer having a magnetization in a fixed direction, a free layer having a magnetization in a variable direction, and a gap layer located between the magnetization pinned layer and the free layer, and the magnetization pinned layer, the gap layer and the free layer are stacked in a direction parallel to the first virtual straight line.

6. The magnetic sensor according to claim 5, wherein, in the at least one magnetoresistive element, the current passes through at least the free layer.

7. The magnetic sensor according to claim 5, wherein, in the at least one magnetoresistive element, the current passes through the magnetization pinned layer, the gap layer and the free layer.

8. A magnetic sensor comprising: at least one yoke formed of a soft magnetic material; at least one magnetic detection element; and a current path for passing a current through the at least one magnetic detection element, wherein the at least one yoke is configured to receive an input magnetic field and to generate an output magnetic field, the input magnetic field containing an input magnetic field component in a direction parallel to a first virtual straight line, the output magnetic field contains an output magnetic field component in a direction parallel to a second virtual straight line intersecting the first virtual straight line, the output magnetic field component varying depending on the input magnetic field component, the at least one magnetic detection element is configured to be energized by the current path, to receive the output magnetic field and to generate a detection value corresponding to the output magnetic field component, the at least one yoke is electrically continuous with the at least one magnetic detection element, the magnetic sensor further comprising at least one conductive layer formed of a nonmagnetic conductive material and connecting the at least one yoke and the at least one magnetic detection element, a power supply port, a ground port, and an output port, wherein the at least one yoke is a first yoke and a second yoke, and a third yoke, the at least one magnetic detection element is at least one first magnetoresistive element and at least one second magnetoresistive element, the at least one first magnetoresistive element is provided between the power supply port and the output port, the at least one second magnetoresistive element is provided between the ground port and the output port, the current path includes a first portion connecting the power supply port and the at least one first magnetoresistive element, a second portion connecting the ground port and the at least one second magnetoresistive element, and a third portion connecting the at least one first magnetoresistive element and the at least one second magnetoresistive element, the first yoke is configured to generate a first output magnetic field containing a first output magnetic field component in a first direction, the first output magnetic field component develops between the first yoke and the third yoke, the second yoke is configured to generate a second output magnetic field containing a second output magnetic field component in a second direction opposite to the first direction, the second output magnetic field component develops between the second yoke and the third yoke, the at least one first magnetoresistive element is configured to receive the first output magnetic field and to generate a first resistance value, the first resistance value being a detection value corresponding to the first output magnetic field component, the at least one second magnetoresistive element is configured to receive the second output magnetic field and to generate a second resistance value, the second resistance value being a detection value corresponding to the second output magnetic field component, one of the first and second resistance values increases whereas the other decreases in response to a change in the input magnetic field component, the output port has an electric potential dependent on the input magnetic field component, the first portion of the current path includes a first conductive layer formed of a nonmagnetic conductive material, the second portion of the current path includes a second conductive layer formed of a nonmagnetic conductive material, the third portion of the current path includes a third conductive layer formed of a nonmagnetic conductive material, each of the first yoke, the second yoke, the at least one first magnetoresistive element, and the at least one second magnetoresistive element has a first surface lying at an end in a third direction which is a direction parallel to the first virtual straight line, each of the third yoke, the at least one first magnetoresistive element, and the at least one second magnetoresistive element has a second surface lying at an end in a fourth direction opposite to the third direction, the first conductive layer is in direct contact with the first surface of the first yoke and the first surface of the at least one first magnetoresistive element, and connects the first yoke and the at least one first magnetoresistive element, the second conductive layer is in direct contact with the first surface of the second yoke and the first surface of the at least one second magnetoresistive element, and connects the second yoke and the at least one second magnetoresistive element, and the third conductive layer is in direct contact with the second surface of the at least one first magnetoresistive element, the second surface of the at least one second magnetoresistive element, and the second surface of the third yoke, and connects the at least one first magnetoresistive element and the at least one second magnetoresistive element.

9. The magnetic sensor according to claim 8, wherein the at least one first magnetoresistive element and the at least one second magnetoresistive element each include a magnetization pinned layer having a magnetization in a fixed direction, a free layer having a magnetization in a variable direction, and a gap layer located between the magnetization pinned layer and the free layer, and the magnetization pinned layer, the gap layer and the free layer are stacked in a direction parallel to the first virtual straight line.

10. The magnetic sensor according to claim 9, wherein, in each of the at least one first magnetoresistive element and the at least one second magnetoresistive element, the current passes through the magnetization pinned layer, the gap layer and the free layer.

11. The magnetic sensor according to claim 8, wherein the first yoke constitutes at least part of the first portion of the current path, and the second yoke constitutes at least part of the second portion of the current path.

\* \* \* \* \*